United States Patent
Sung et al.

(10) Patent No.: US 10,978,561 B2
(45) Date of Patent: Apr. 13, 2021

(54) LAYER, MULTILEVEL ELEMENT, METHOD FOR FABRICATING MULTILEVEL ELEMENT, AND METHOD FOR DRIVING MULTILEVEL ELEMENT

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Jinwon Jung, Suwon-si (KR); Hongbum Kim, Seoul (KR); Jin Seon Park, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 22 days.

(21) Appl. No.: 16/214,872

(22) Filed: Dec. 10, 2018

(65) Prior Publication Data
US 2019/0115432 A1 Apr. 18, 2019

Related U.S. Application Data

(63) Continuation of application No. PCT/KR2018/012365, filed on Oct. 18, 2018.

(30) Foreign Application Priority Data

Oct. 18, 2017 (KR) .................. 10-2017-0134978
Oct. 18, 2018 (KR) .................. 10-2018-0124635
Oct. 18, 2018 (KR) .................. 10-2018-0124645

(51) Int. Cl.
*H01L 29/15* (2006.01)
*H01L 29/76* (2006.01)
(Continued)

(52) U.S. Cl.
CPC ............ *H01L 29/151* (2013.01); *H01L 29/04* (2013.01); *H01L 29/122* (2013.01); *H01L 29/15* (2013.01);
(Continued)

(58) Field of Classification Search
CPC ..... H01L 29/151; H01L 29/22; H01L 29/152; H01L 29/78693; H01L 29/66969;
(Continued)

(56) References Cited

U.S. PATENT DOCUMENTS

| 4,688,061 A | 8/1987 | Sakaki |
| 5,223,724 A | 6/1993 | Green, Jr. |

(Continued)

FOREIGN PATENT DOCUMENTS

| JP | 7-161965 A | 6/1995 |
| JP | 8-69966 A | 3/1996 |

(Continued)

OTHER PUBLICATIONS

International Search Report dated Jan. 31, 2019 from the International Bureau in Application No. PCT/KR2018/012365.
(Continued)

*Primary Examiner* — Mohammed R Alam
(74) *Attorney, Agent, or Firm* — Sughrue Mion, PLLC

(57) ABSTRACT

A layer according to one embodiment of the present invention may exhibit a first number of electron states in a low-level electron energy range in a conduction band, and exhibit a second number of electron states in a high-level electron energy range higher than the low-level electron energy level in the conduction band, wherein localized states may exist between the low-level electron energy range and the high-level electron energy level.

8 Claims, 39 Drawing Sheets

(51) Int. Cl.

| | | |
|---|---|---|
| *H01L 29/22* | (2006.01) | |
| *H01L 29/786* | (2006.01) | |
| *H01L 29/66* | (2006.01) | |
| *H01L 51/05* | (2006.01) | |
| *H01L 29/04* | (2006.01) | |
| *H01L 29/12* | (2006.01) | |
| *H01L 29/417* | (2006.01) | |
| *H01L 29/423* | (2006.01) | |
| *H01L 29/51* | (2006.01) | |

(52) U.S. Cl.
CPC ............ *H01L 29/152* (2013.01); *H01L 29/22* (2013.01); *H01L 29/2206* (2013.01); *H01L 29/41725* (2013.01); *H01L 29/4232* (2013.01); *H01L 29/517* (2013.01); *H01L 29/66969* (2013.01); *H01L 29/7606* (2013.01); *H01L 29/7613* (2013.01); *H01L 29/7869* (2013.01); *H01L 29/78693* (2013.01); *H01L 29/78696* (2013.01); *H01L 51/0562* (2013.01); *H01L 29/66977* (2013.01)

(58) Field of Classification Search
CPC ............ H01L 51/0562; H01L 29/2206; H01L 29/7869; H01L 29/78696; H01L 29/04; H01L 29/122; H01L 29/15; H01L 29/41725; H01L 29/4232; H01L 29/517; H01L 29/7613; H01L 29/7606; H01L 29/66977; H01L 29/127; B82Y 10/00
See application file for complete search history.

(56) References Cited

U.S. PATENT DOCUMENTS

| | | |
|---|---|---|
| 5,412,224 A | 5/1995 | Goronkin et al. |
| 6,410,947 B1 | 6/2002 | Wada |
| 9,673,311 B1 | 6/2017 | Moens et al. |
| 2002/0185655 A1 | 12/2002 | Fahimulla et al. |
| 2005/0064675 A1 | 3/2005 | Kim |
| 2006/0263957 A1 | 11/2006 | Wong et al. |
| 2007/0122983 A1 | 5/2007 | Pan et al. |
| 2012/0104358 A1 | 5/2012 | de Rochemont |
| 2012/0138922 A1 | 6/2012 | Yamazaki et al. |
| 2013/0009145 A1 | 1/2013 | Jeon et al. |
| 2014/0009270 A1 | 1/2014 | Yamazaki |
| 2017/0179263 A1* | 6/2017 | Pourtois ............ H01L 29/78648 |
| 2018/0033858 A1 | 2/2018 | Moon et al. |
| 2018/0108753 A1 | 4/2018 | Chen et al. |
| 2018/0337288 A1 | 11/2018 | Shin |
| 2019/0115431 A1 | 4/2019 | Sung et al. |
| 2020/0194699 A1 | 6/2020 | Sung et al. |

FOREIGN PATENT DOCUMENTS

| | | |
|---|---|---|
| JP | 2005-101530 A | 4/2005 |
| JP | 2014-502417 A | 1/2014 |
| KR | 10-2001-0014924 A | 2/2001 |
| KR | 10-2007-0068736 A | 7/2007 |
| KR | 10-2008-0083126 A | 9/2008 |
| KR | 10-2010-0074375 A | 7/2010 |
| KR | 10-2010-0112915 A | 10/2010 |
| KR | 10-1030433 B1 | 4/2011 |
| KR | 10-2013-0004836 A | 1/2013 |
| KR | 10-2016-0099346 A | 8/2016 |
| WO | 2010/104717 A2 | 9/2010 |
| WO | 2010/104717 A3 | 9/2010 |

OTHER PUBLICATIONS

Notice of Reasons for Refusal dated Jan. 28, 2020, from the Japanese Patent Office in Application No. 2018-565729.
Godlewski et al., "ZnO layers grown by Atomic Layer Deposition: A new material for transparent conductive oxide", Thin Solid Films, vol. 518, pp. 1145-1148, 2009, 4 pages total.
Extended European Search Report dated Mar. 25, 2020 in EP 18213778.6.

* cited by examiner

[Fig. 1]
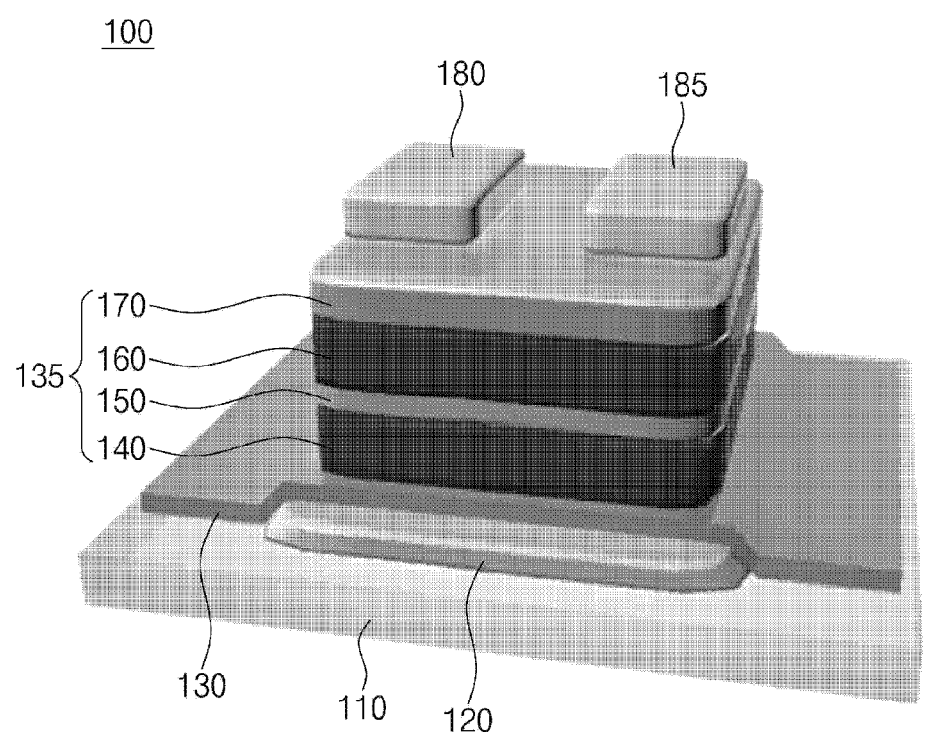

[Fig. 2]
150
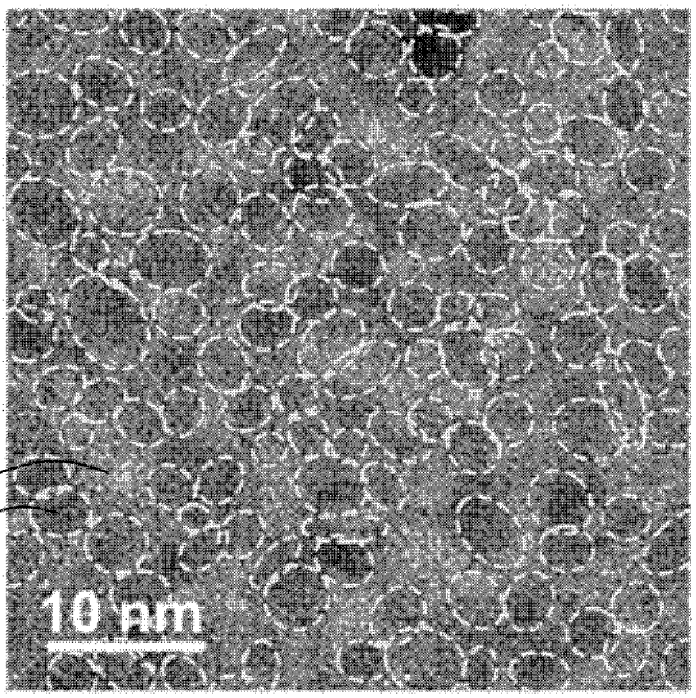

[Fig. 3]
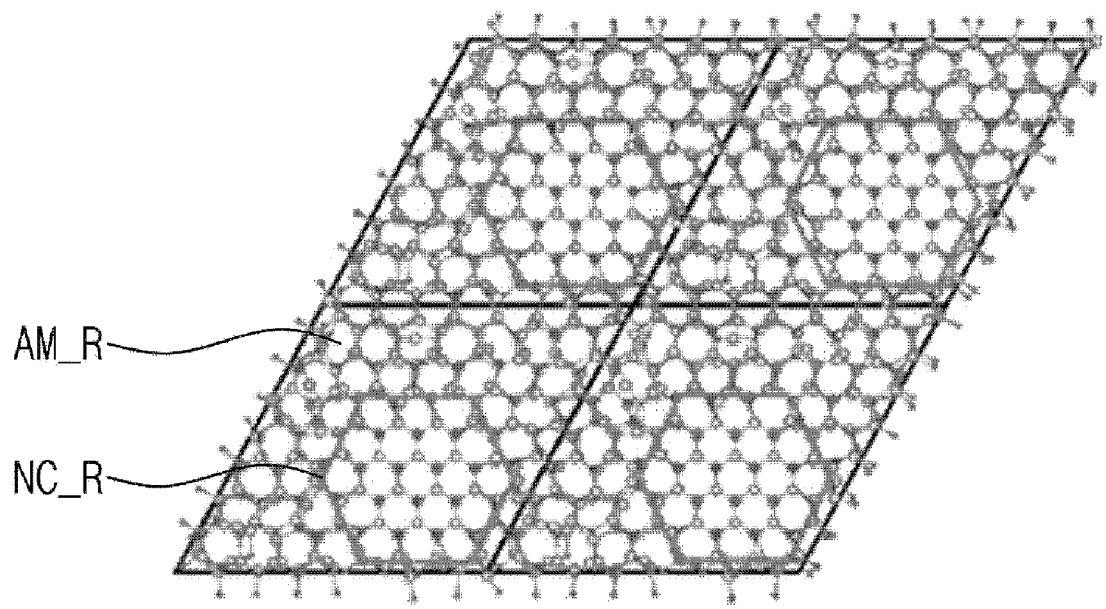

[Fig. 4]
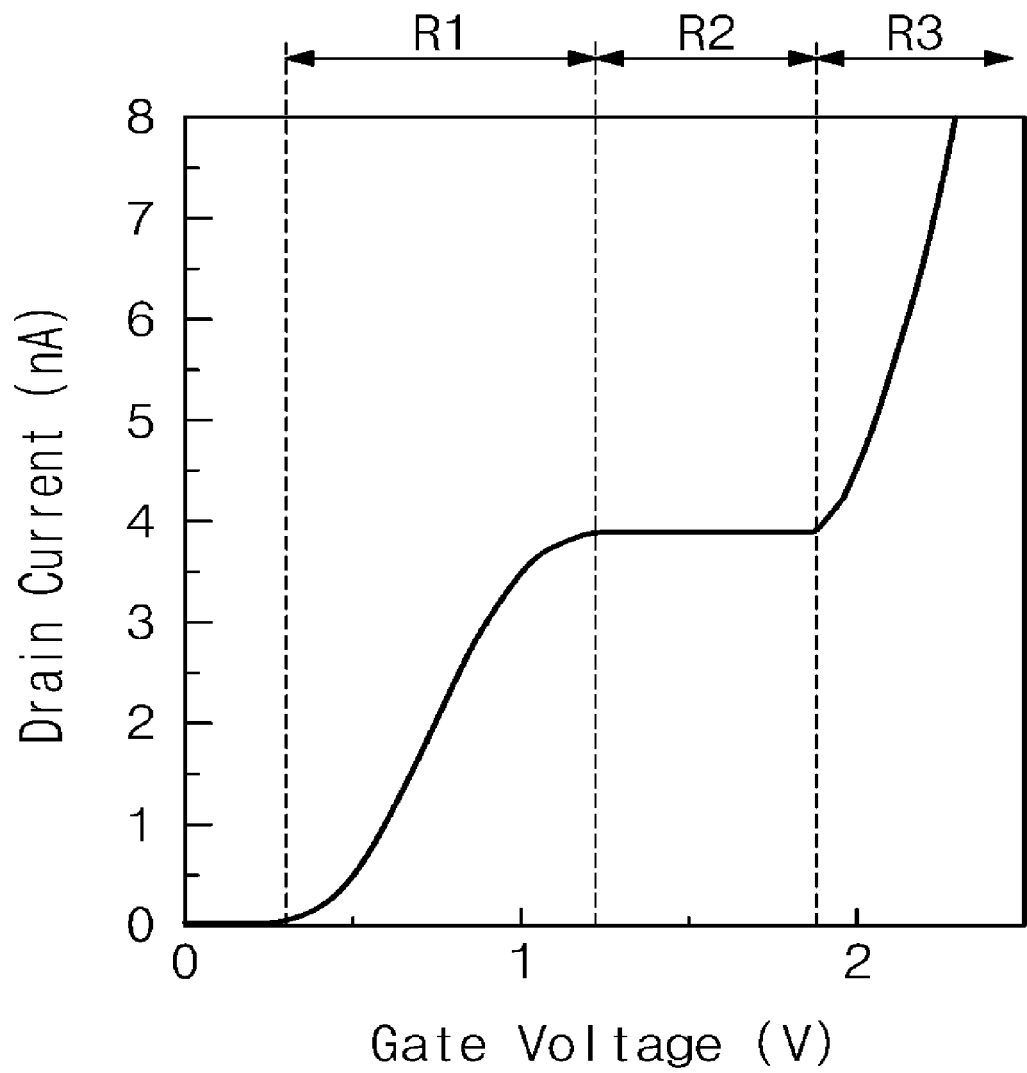

[Fig. 5(a)]
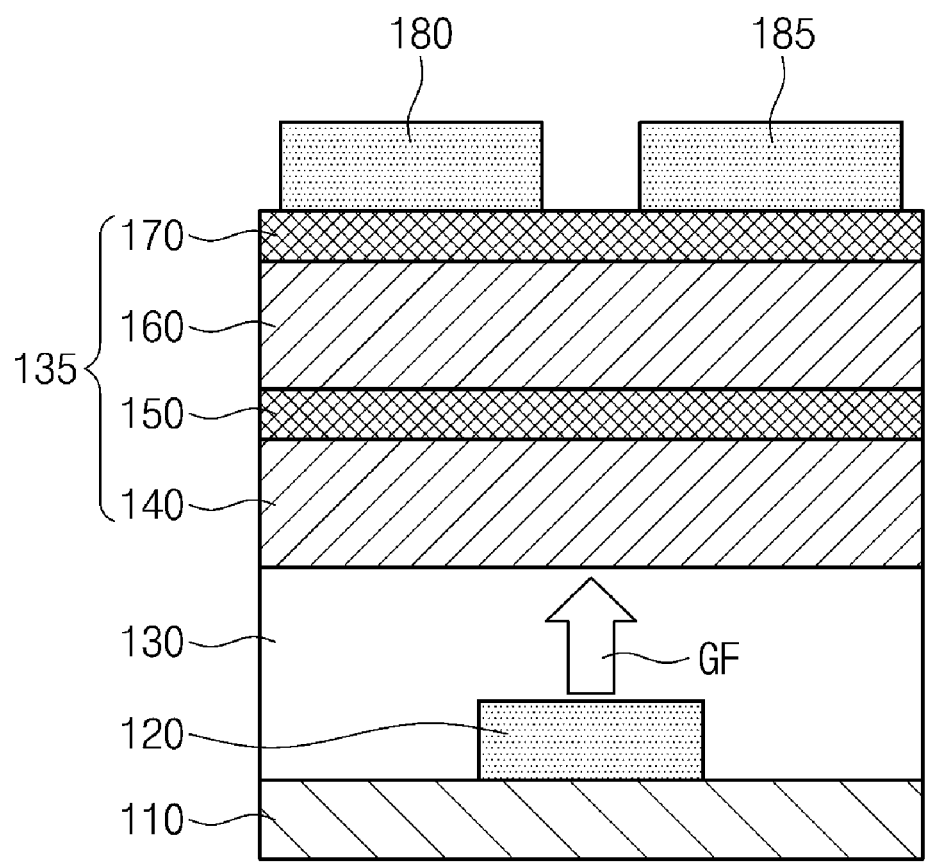

[Fig. 5(b)]
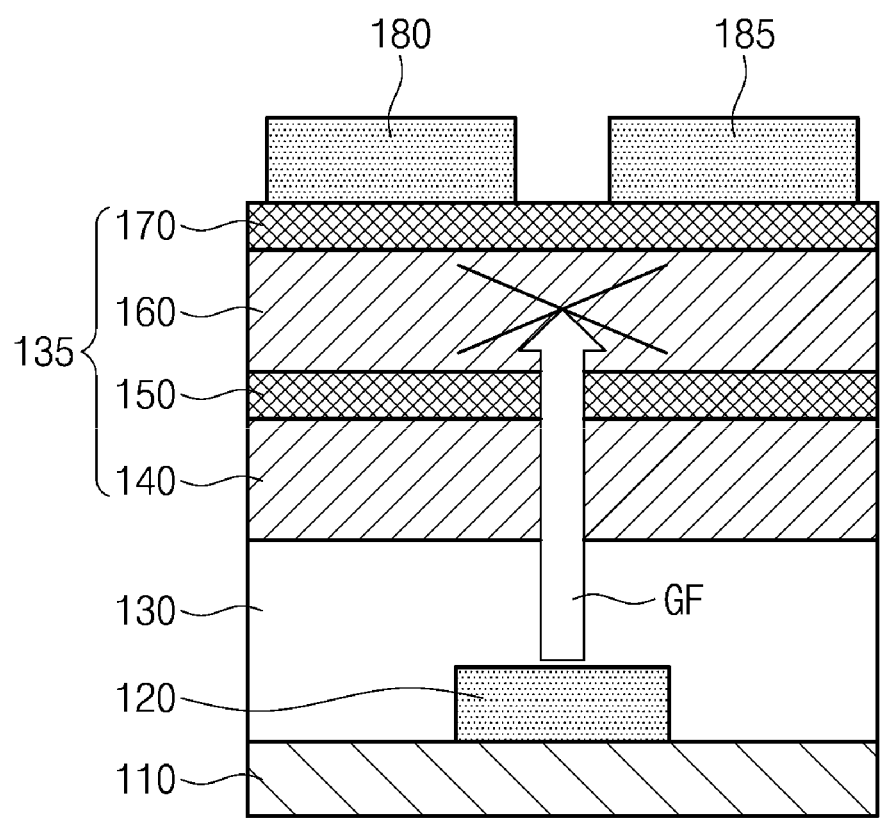

[Fig. 5(c)]
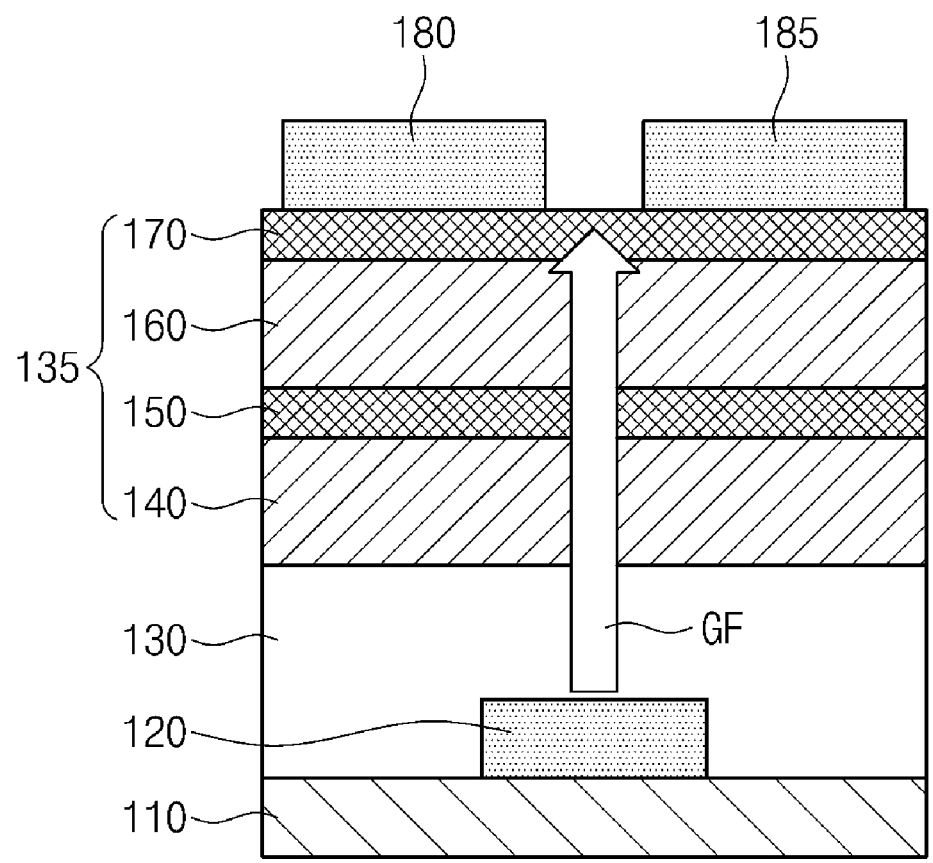

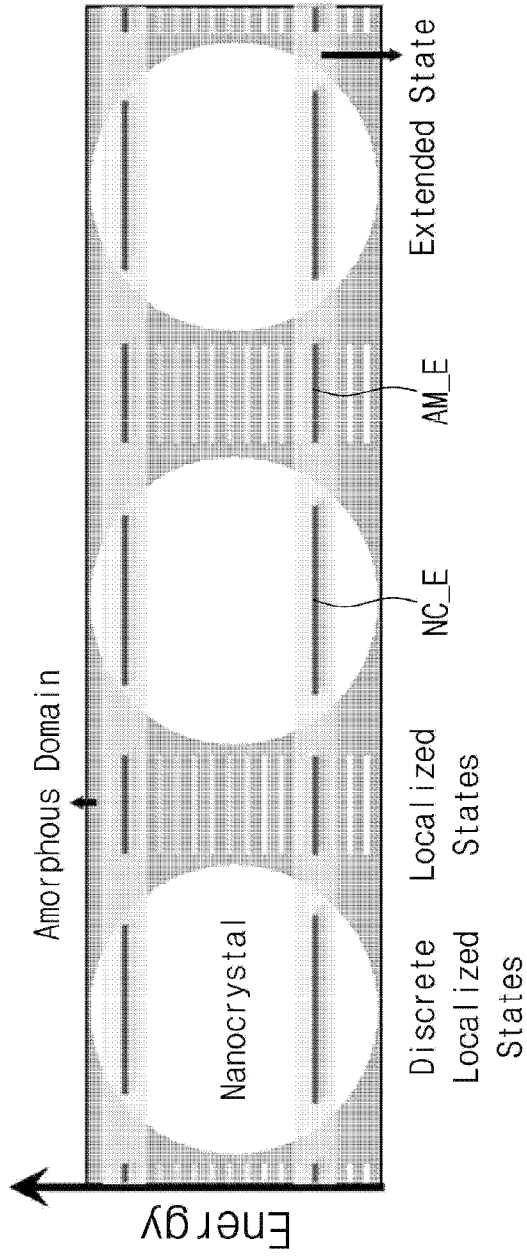
[Fig. 6]

[Fig. 7]
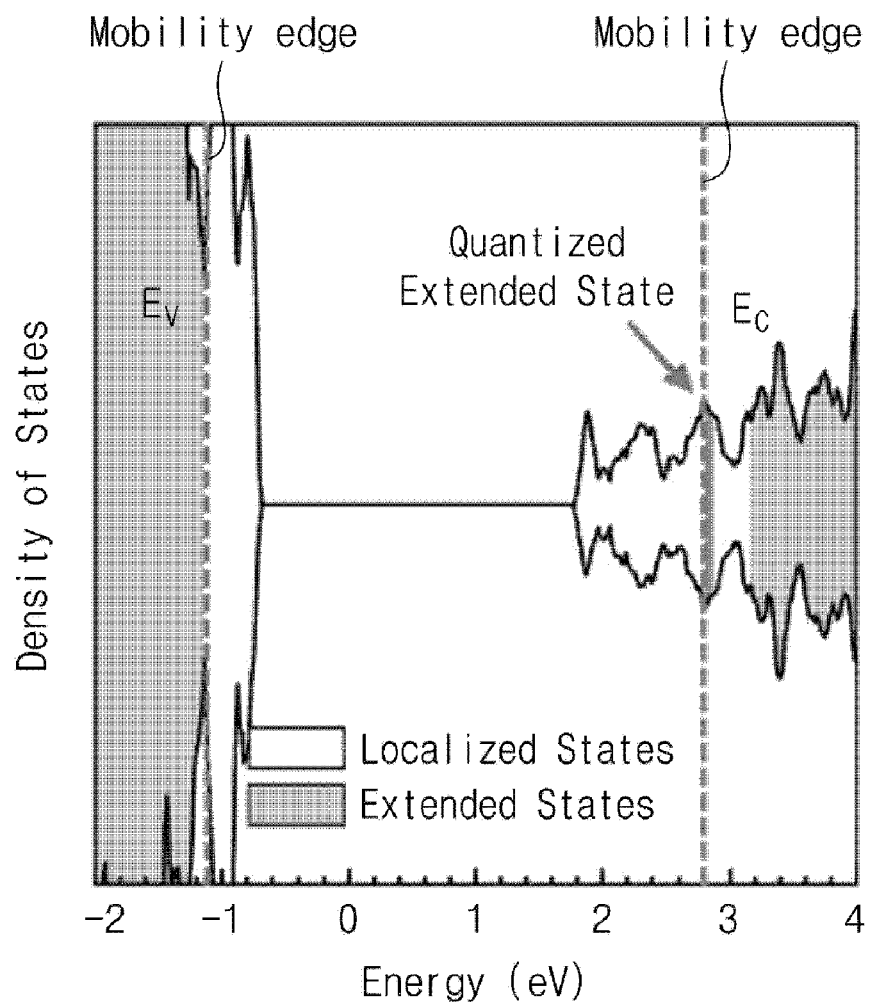

[Fig.8(a)]
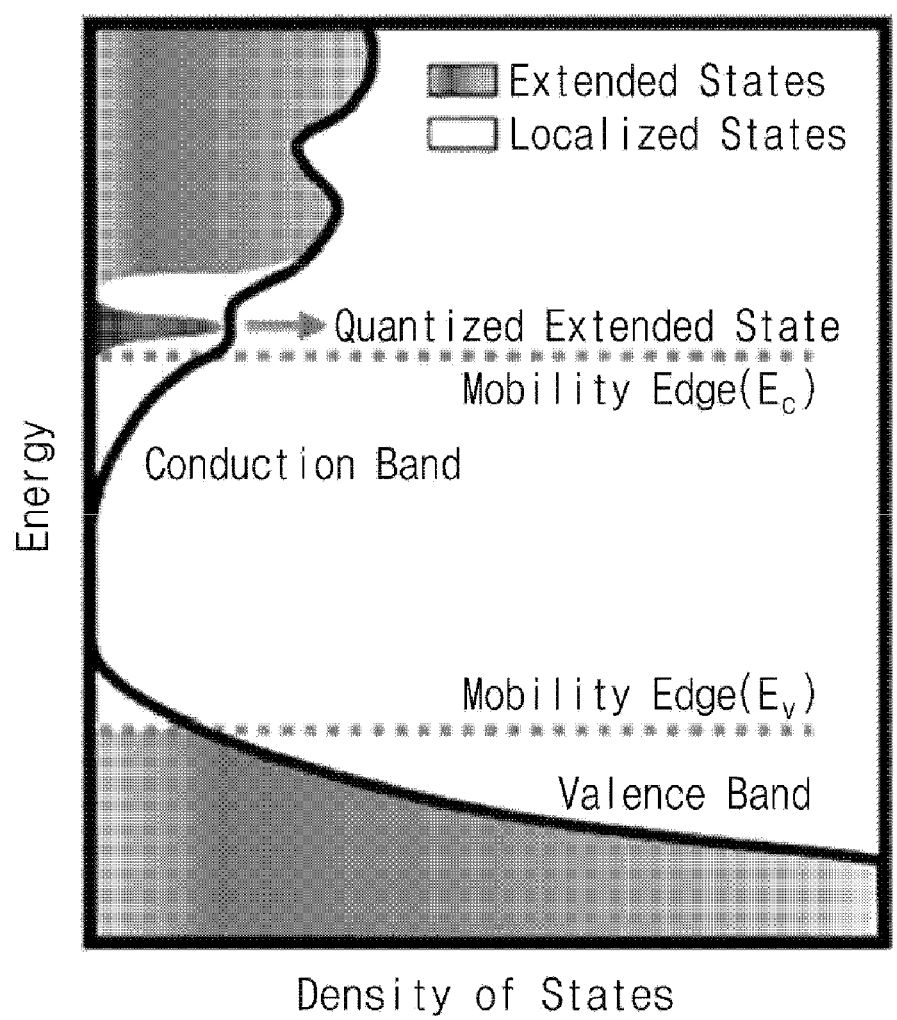

[Fig.8(b)]
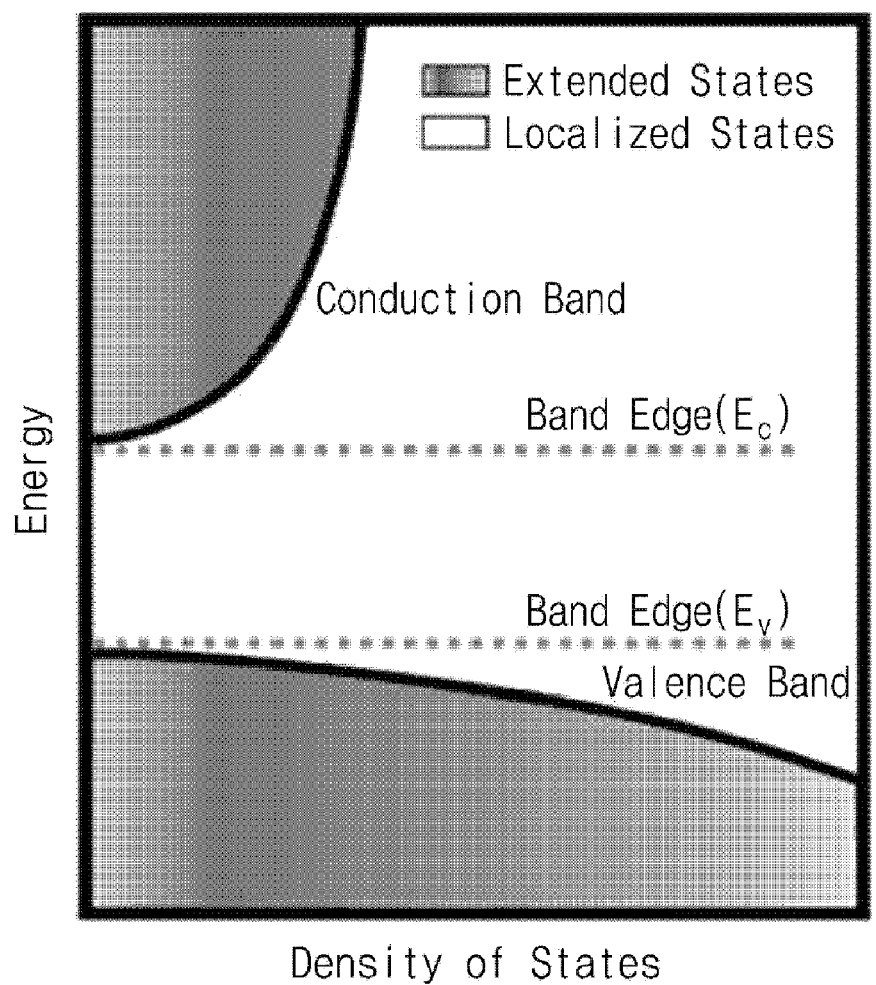

[Fig. 8(c)]
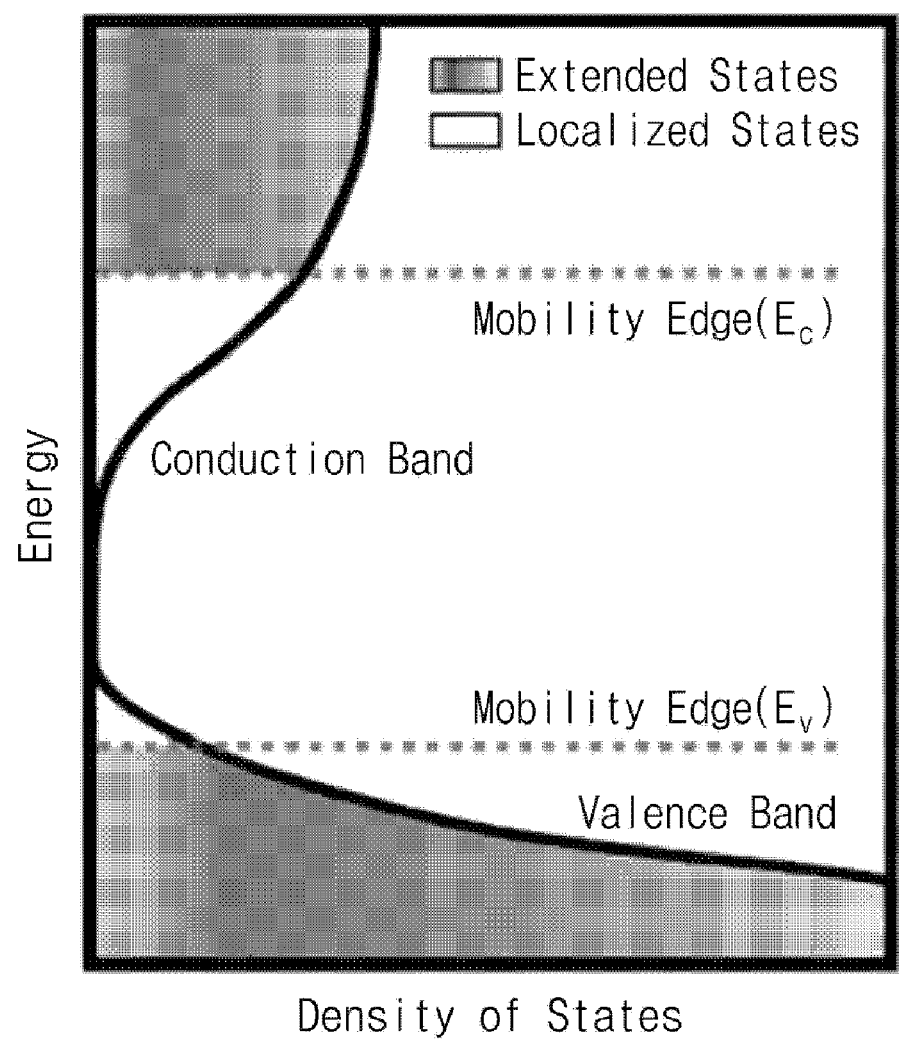

[Fig. 9(a)]
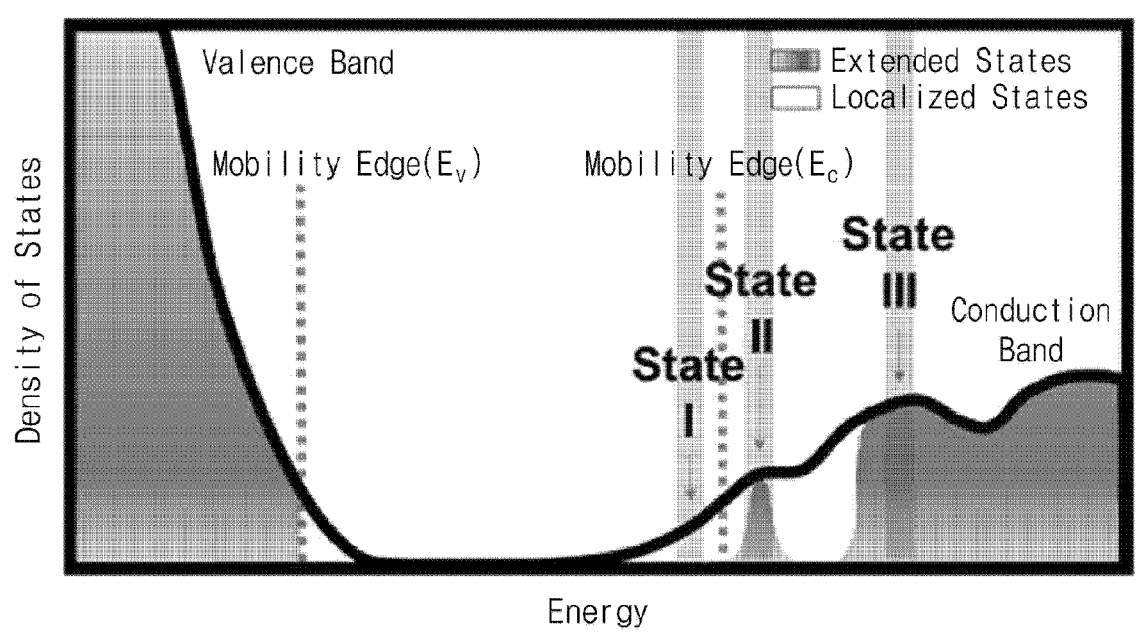

[Fig. 9(b)]
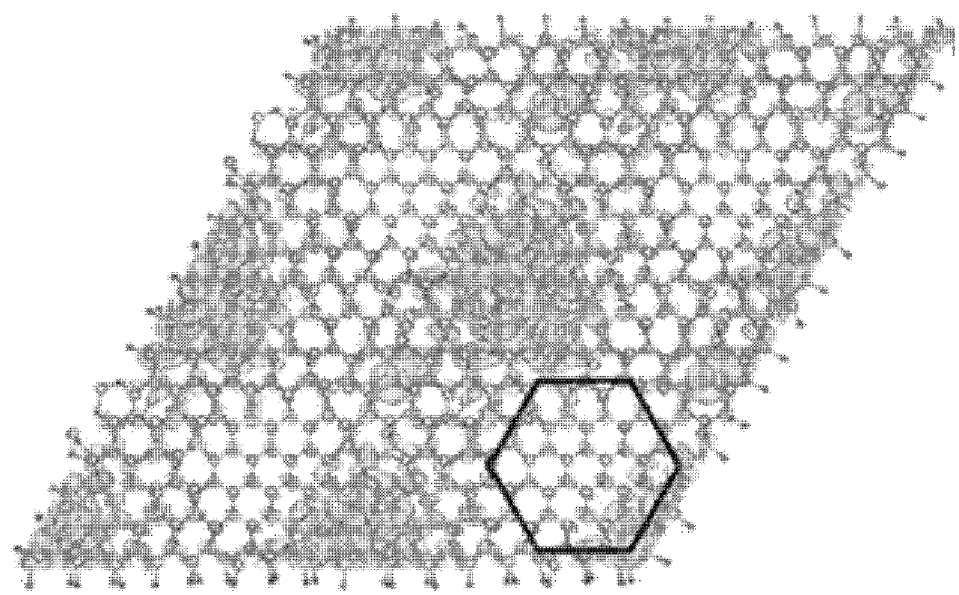
State I

[Fig. 9(c)]
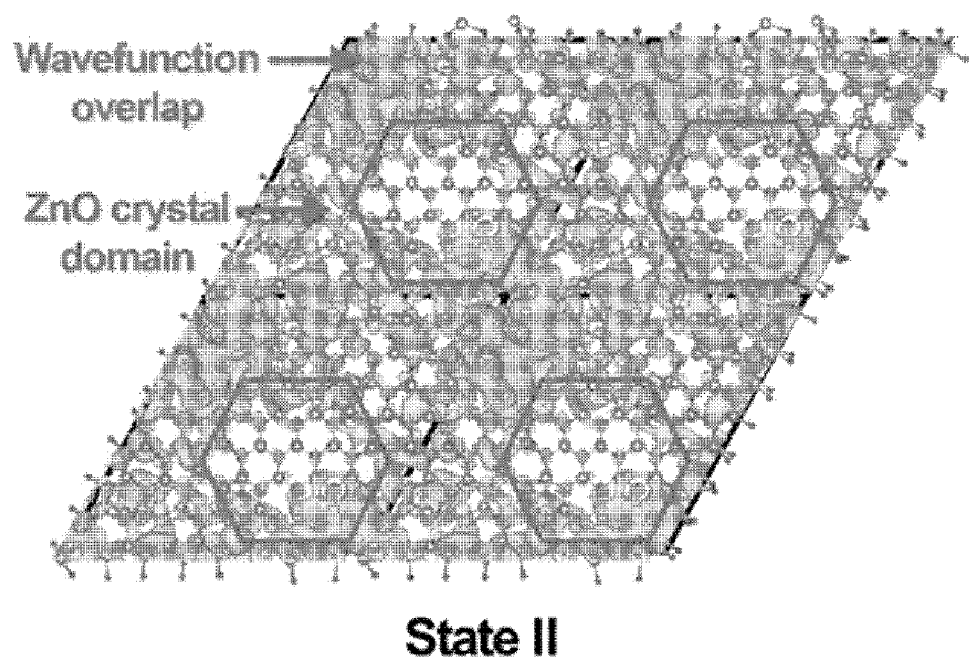

[Fig. 9(d)]
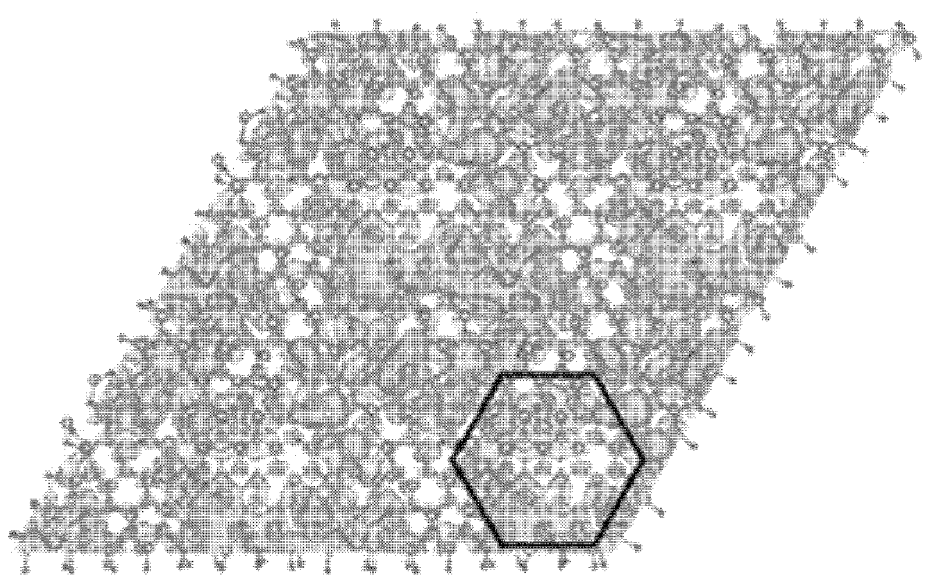
State III

[Fig. 10(a)]
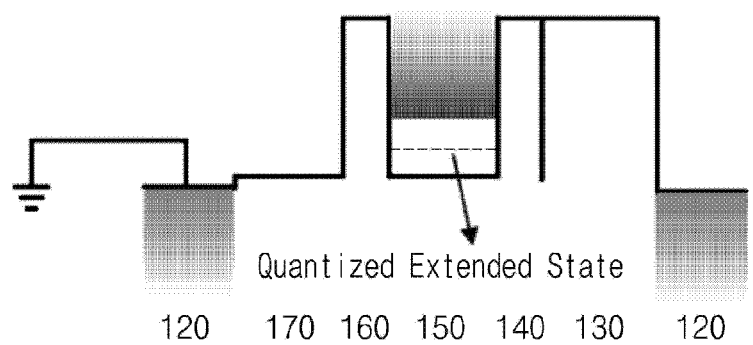

[Fig. 10(b)]
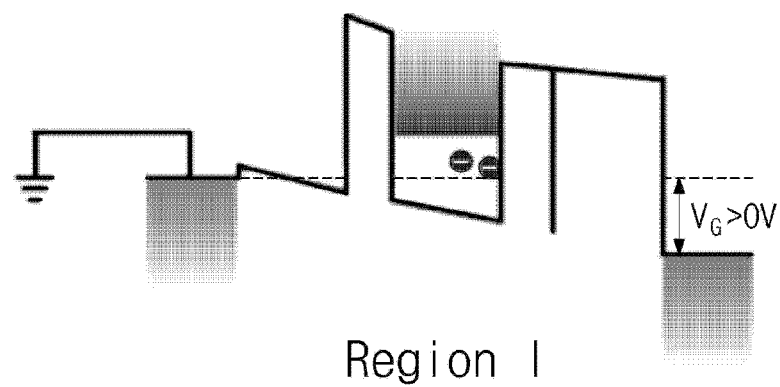
Region I

[Fig. 10(c)]
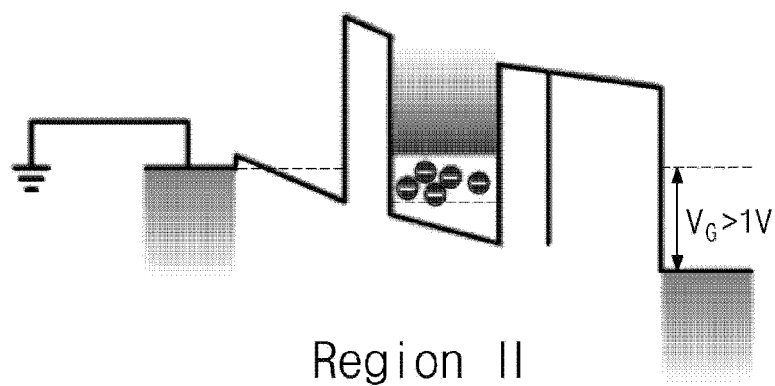
Region II

[Fig. 10(d)]
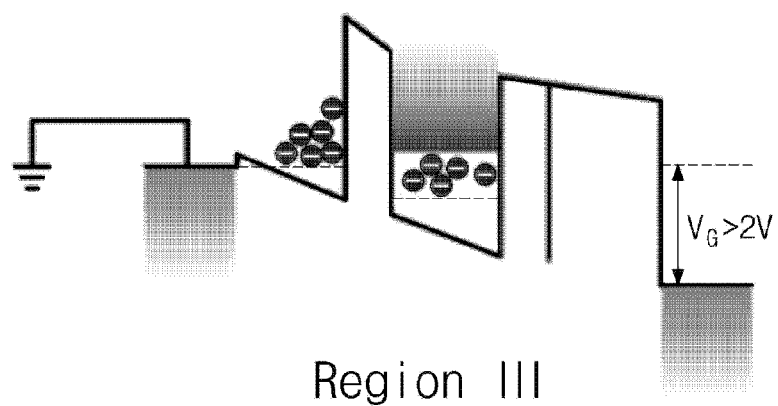
Region III

[Fig. 11]
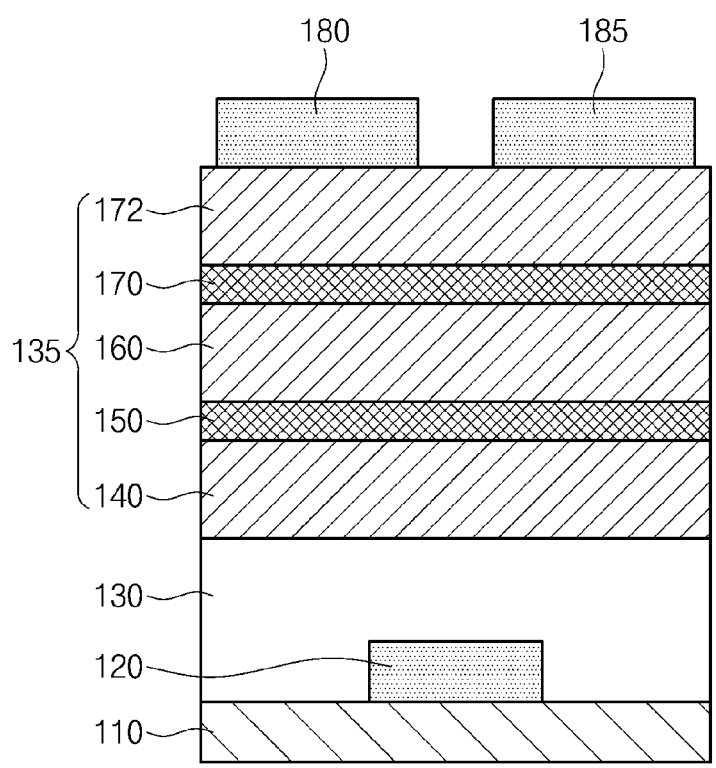

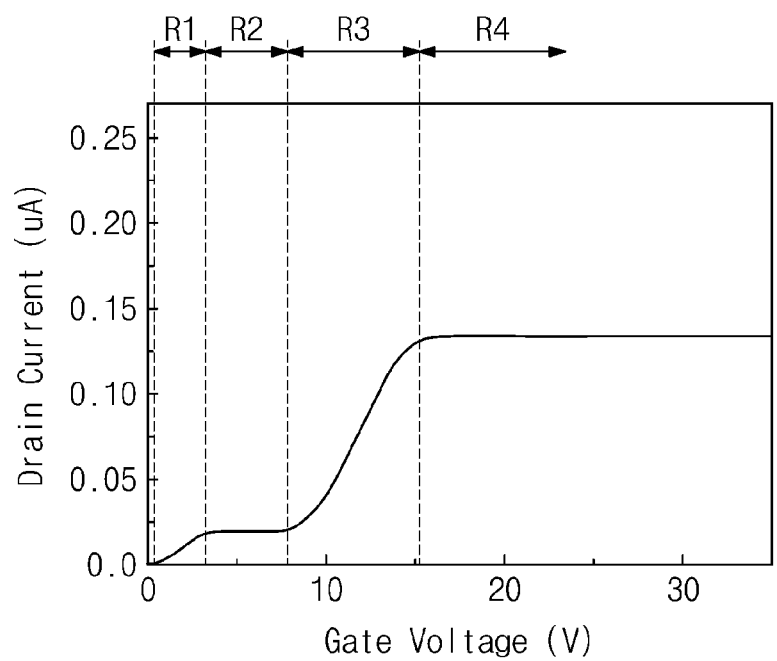
[Fig. 12]

[Fig. 13]
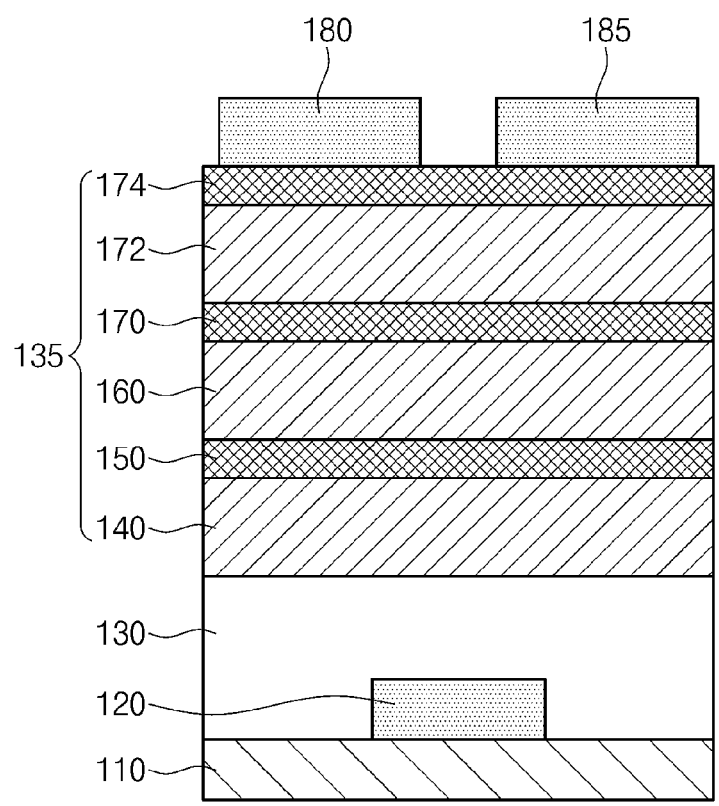

[Fig. 14]
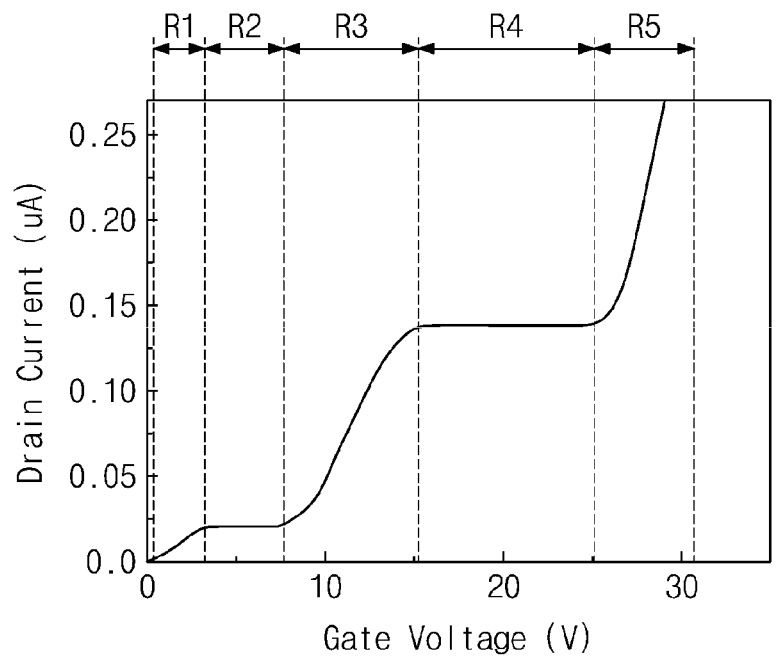

[Fig. 15]
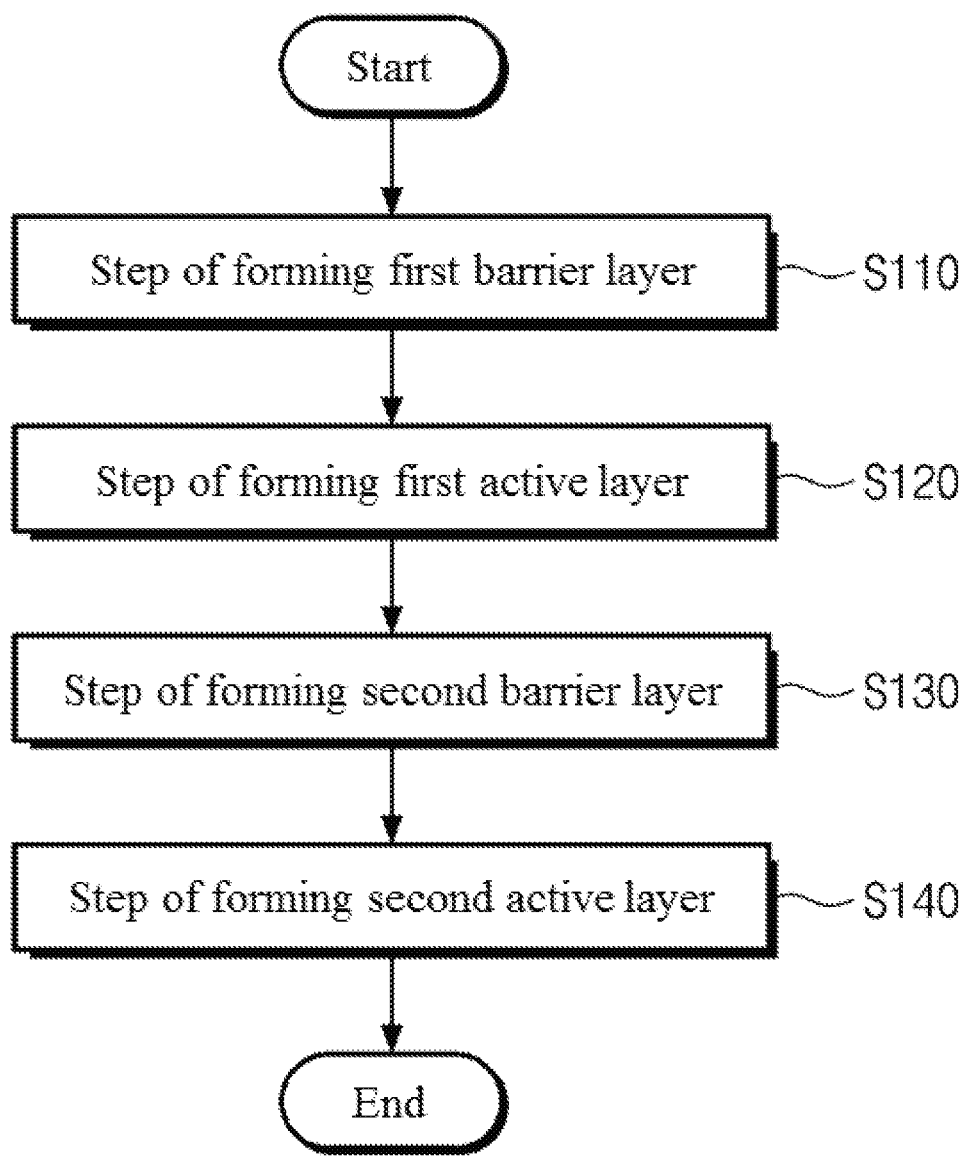

【Fig. 16】
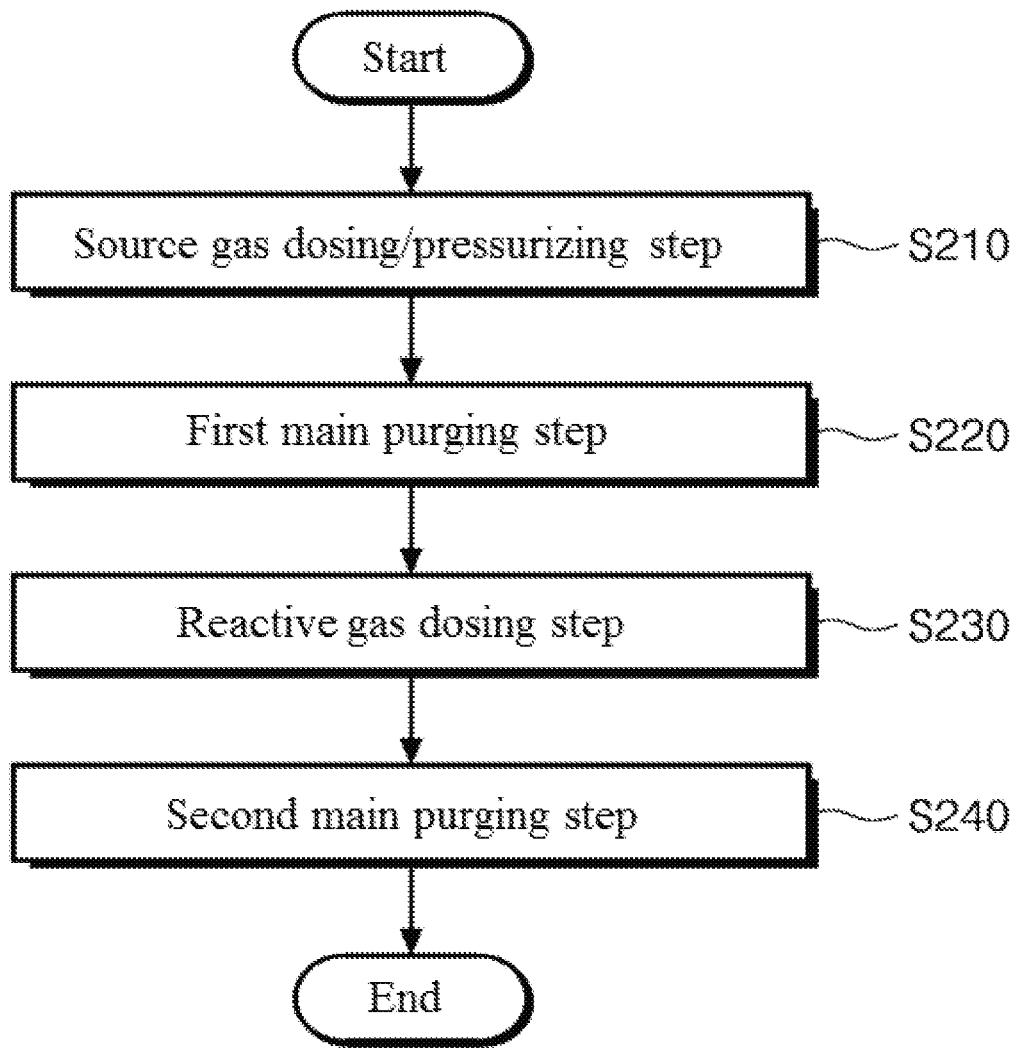

[Fig. 17]
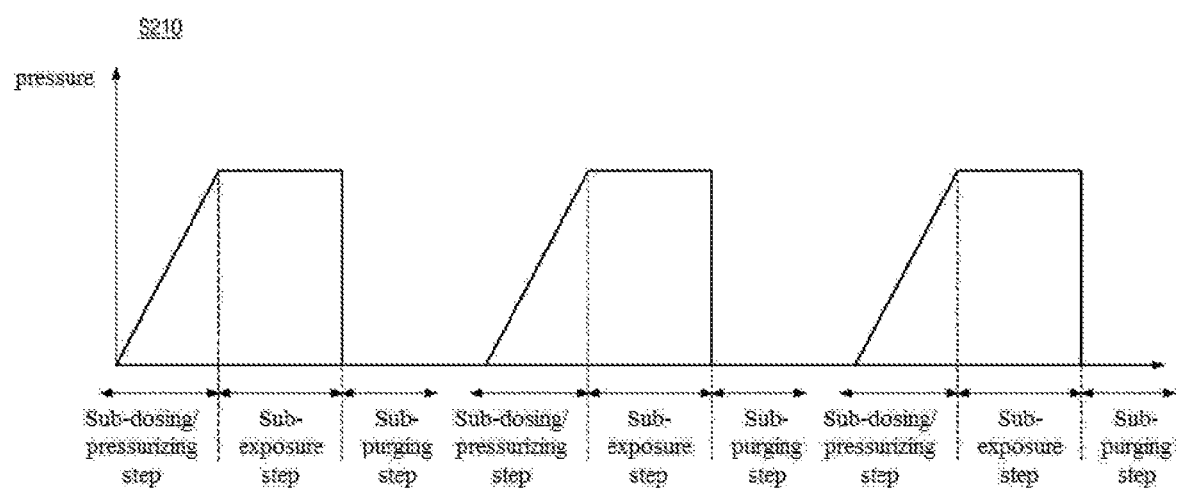

[Fig. 18]
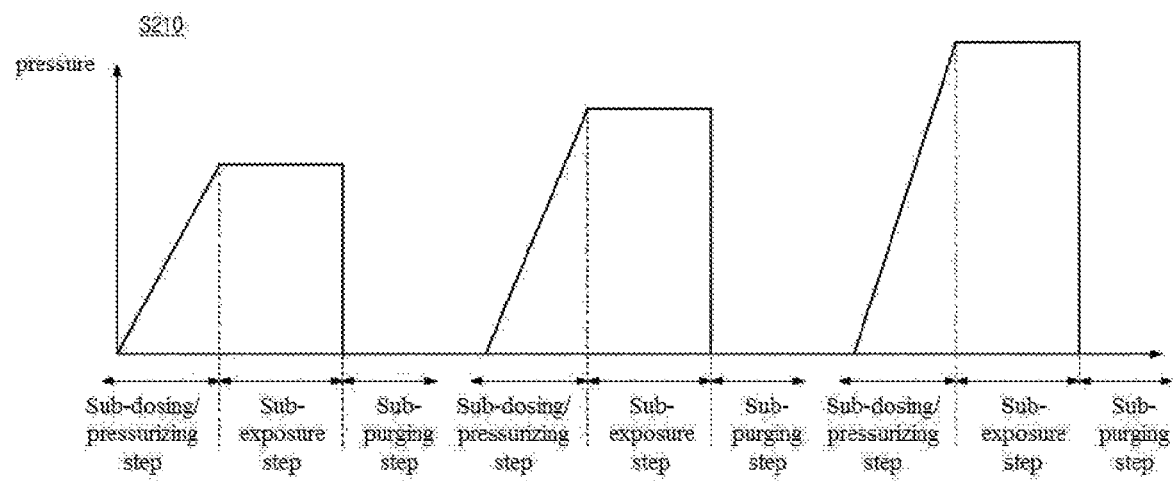

[Fig. 19]

| DEZ | P | DEZ | P | DEZ | P | DEZ | P |
|---|---|---|---|---|---|---|---|
| 3s | 15s | 3s | 15s | 3s | 15s | 3s | 15s |
| 1 Torr | | 1 Torr | | 1 Torr | | 1 Torr | |
| H$_2$O | P | H$_2$O | P | H$_2$O | P | H$_2$O | P |
| 3s | 25s | 3s | 25s | 3s | 25s | 3s | 25s |
| 1 Torr | | 1 Torr | | 1 Torr | | 1 Torr | |

S120

[Fig. 20]
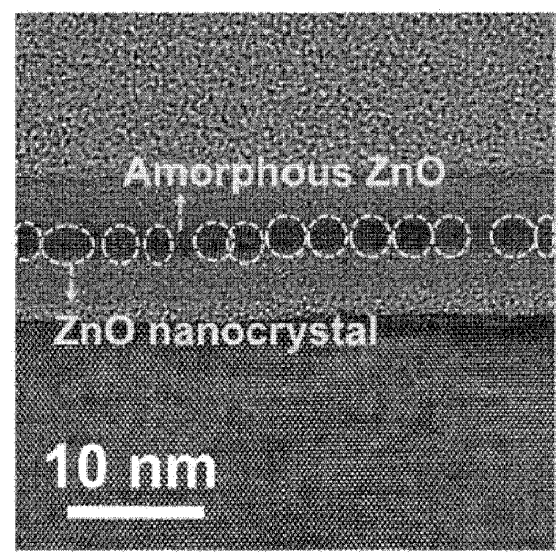

[Fig. 21(a)]
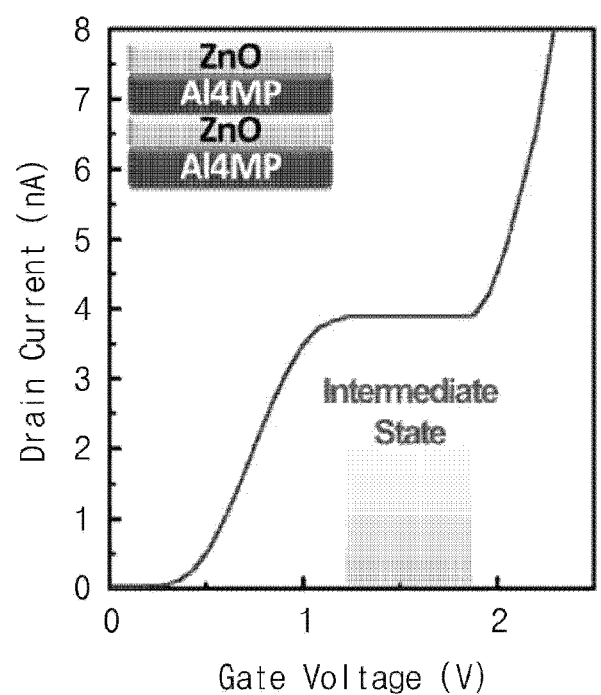

[Fig. 21(b)]
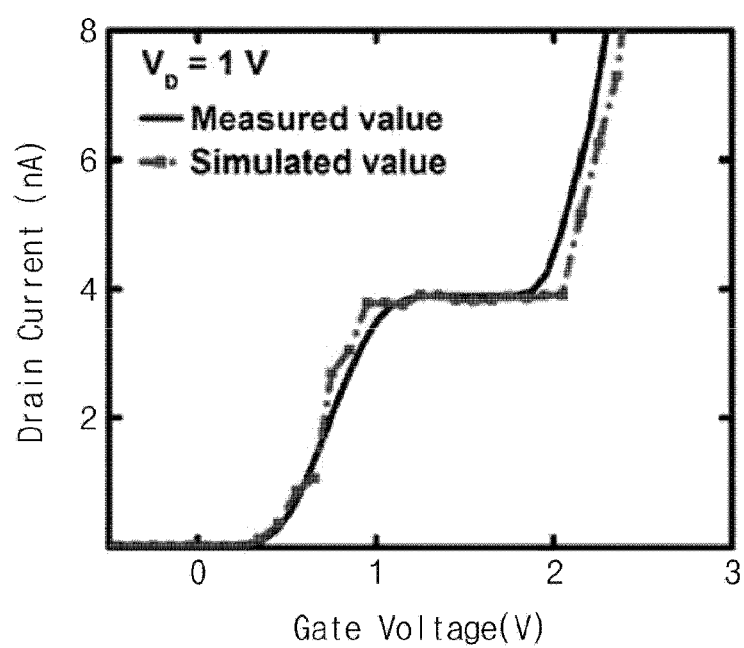

[Fig. 22]
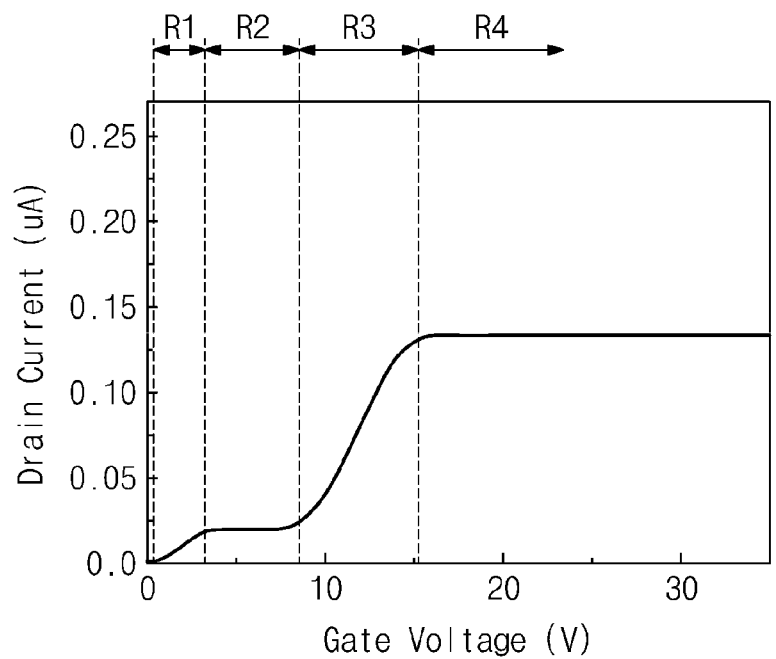

[Fig. 23]
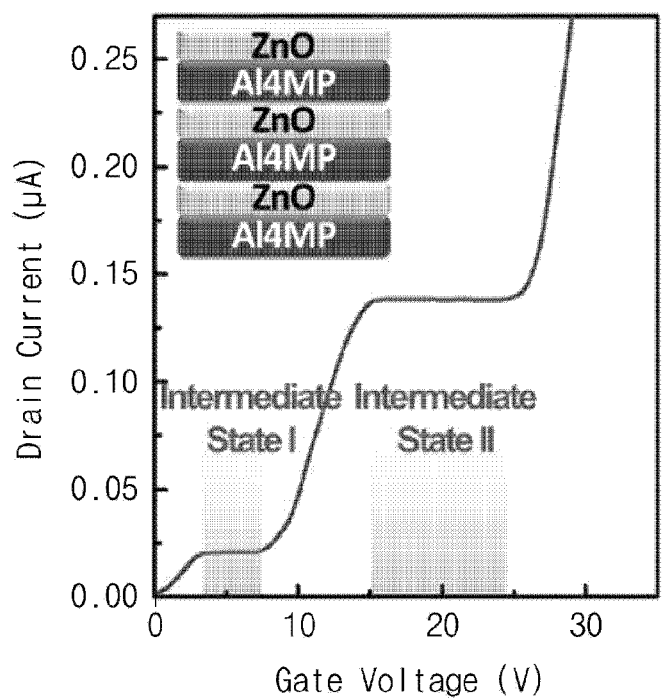

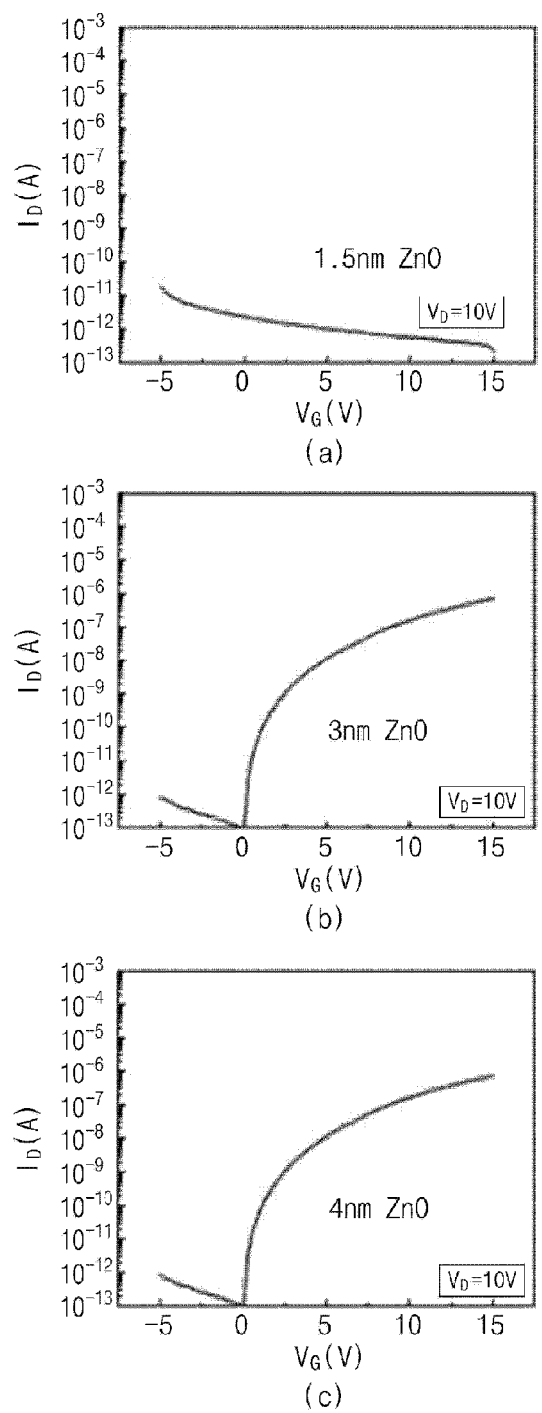
[Fig. 24(a)]

[Fig. 24(b)]
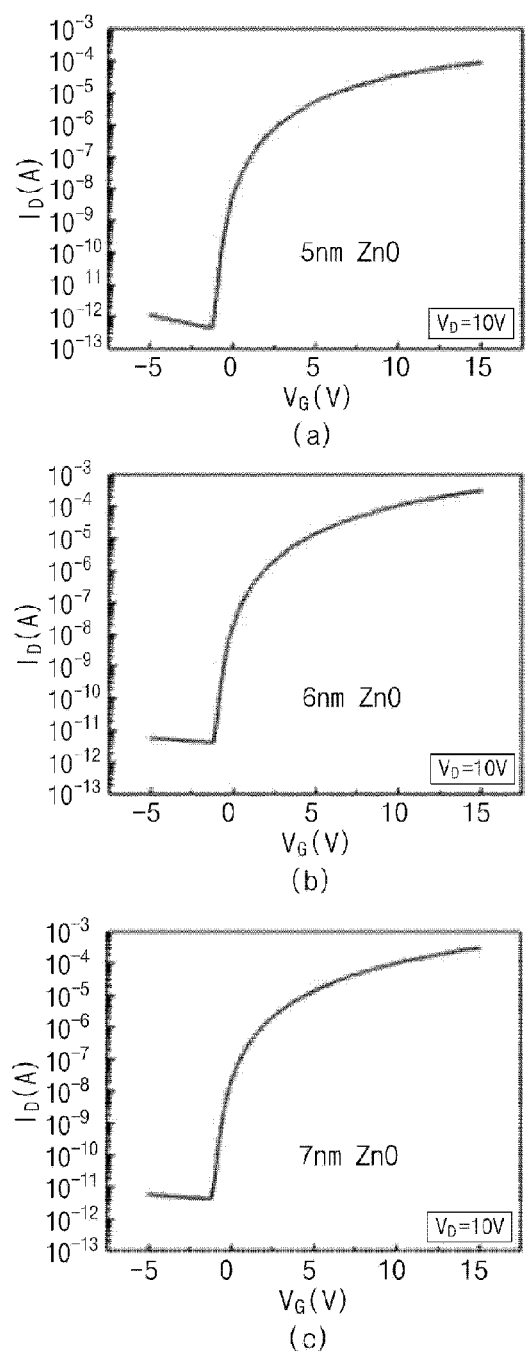

[Fig. 24(c)]
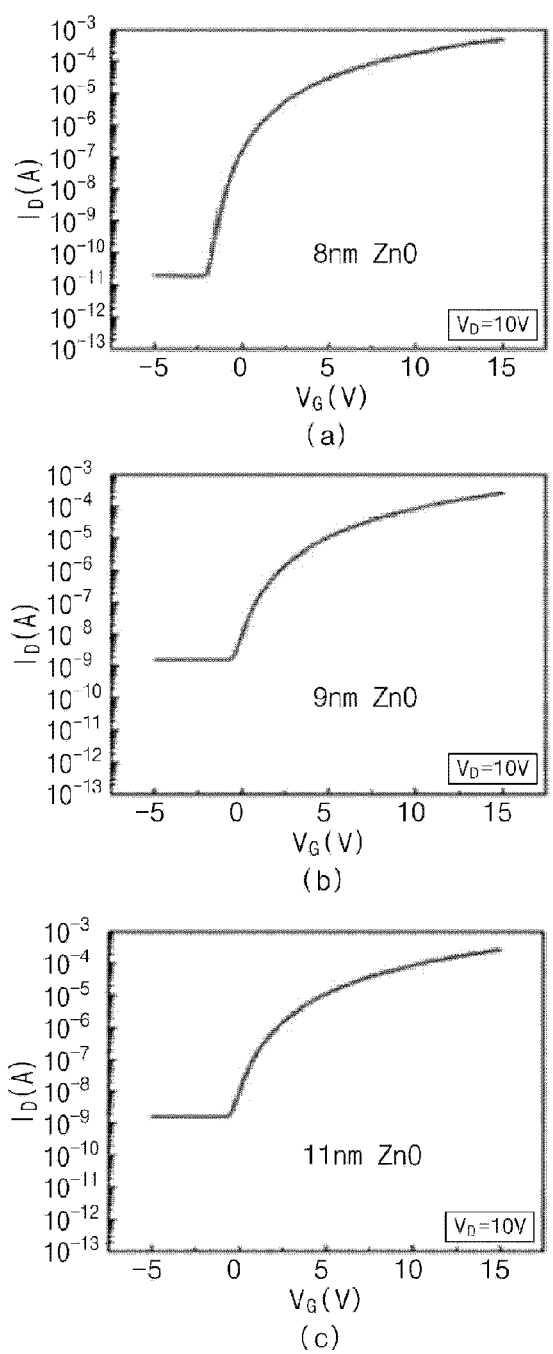

[Fig. 24(d)]

| Thickness | 1.5nm | 3nm | 4nm | 5nm | 6nm | 7nm | 8nm | 9nm | 11nm |
|---|---|---|---|---|---|---|---|---|---|
| On/Off ratio | - | $7.3*10^6$ | $1.2\times10^8$ | $1.9*10^8$ | $7.6*10^7$ | $2.5*10^7$ | $3.6*10^6$ | $1.7*10^5$ | $1.6*10^5$ |
| Mobility ($Cm^6/Vs$) | - | 0.14 | 6.81 | 30.05 | 37.22 | 50.02 | 34.77 | 29.86 | 31.16 |
| Turn-on voltage | - | 0 | -0.25 | -1.5 | -1.25 | -2.25 | -1.5 | -1.25 | -2.95 |
| SS value (mV/decade) | - | 0.25 | 0.3 | 0.35 | 0.35 | 0.55 | 0.6 | 1.3 | 1.25 |

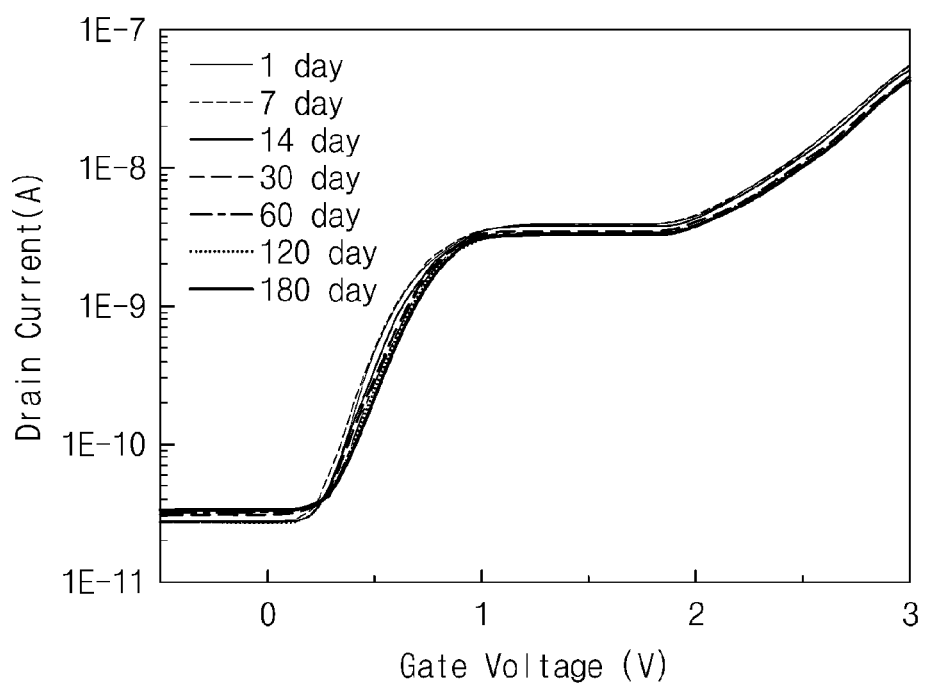
[Fig. 25]

LAYER, MULTILEVEL ELEMENT, METHOD FOR FABRICATING MULTILEVEL ELEMENT, AND METHOD FOR DRIVING MULTILEVEL ELEMENT

TECHNICAL FIELD

The present invention relates to a layer, a multilevel element, a method for fabricating a multilevel element, and a method for driving a multilevel element.

BACKGROUND ART

In recent years, with the development of smart device and artificial intelligence computer technologies, demands for higher performance devices having high performance and multifunctionality have rapidly increased.

However, the binary element fabrication technology that has lead the existing semiconductor industry is expected to reach the limit in technical, economic and principal terms due to continuous ultra-miniaturization and high integration. In other words, development methods based on the down-scaling of conventional MOSFETs have difficulties in the down-scaling technology itself, approaches based on down-scaling are considered to have a fundamental limitation.

To overcome this limitation, studies on multilevel elements have been conducted. Multilevel elements that have been previously studied include single-electron transistors (SETs) and resonant-tunneling transistors (RTTs). In the case of single-electron transistors (SETs) and resonant-tunneling transistors (RTTs), multilevel characteristics are mainly observed only at a very low temperature, complicated fabrication processes are required, and integration for circuit implementation is difficult, which makes it difficult to realize the technology.

Accordingly, the present inventors have invented a layer which exhibits excellent multilevel characteristics while being formed through an easy and simple process, a multilevel element comprising the layer, a method for fabricating a multilevel element, and a method for driving a multilevel element.

DISCLOSURE

Technical Problem

It is an object of the present invention to provide a layer having quantized conduction states.

Another object of the present invention is to provide a layer having quantized conduction states in energy higher than the mobility edge.

Still another object of the present invention is to provide a layer having discrete conduction state depending on the energy level of electrons in the conduction band.

Still another object of the present invention is to provide a layer in which resonance energy matching between crystalline regions and amorphous regions occurs.

Still another object of the present invention is to provide a multilevel element having multilevel conduction characteristics, a method for fabricating the same, and a method for driving the same.

Still another object of the present invention is to provide a fabrication method which may be performed through a low-temperature process.

Still another object of the present invention is to provide a fabrication method which can easily control thickness.

However, objects which are to be achieved by the present invention are not limited to the above-mentioned objects.

Technical Solution

A layer according to one embodiment of the present invention may exhibit a first number of electron states in a low-level electron energy range in a conduction band, and exhibit a second number of electron states in a high-level electron energy range higher than the low-level electron energy level in the conduction band, wherein localized states may exist between the low-level electron energy range and the high-level electron energy level.

According to one embodiment, the number of electron states in localized states in the conduction band may be 0.

According to one embodiment, a maximum electron energy value in the low-level electron energy range may be smaller than a minimum electron energy value in the high-level electron energy value.

According to one embodiment, the first number of electron states may have a normal distribution with respect to an electron energy value at which the number of electron states in the low-level electron energy range is maximal.

According to one embodiment, the maximum value of the first number of electron states in the low-level electron energy level may be smaller than the minimum value of the second number of electron states in the high-level electron energy range.

According to one embodiment, conduction states may exist in the low-level electron energy range and the high-level electron energy level.

According to one embodiment, a mobility edge, which is the lowest energy state in which electrons are capable of existing, exists in the conduction band, and the low-level electron energy range and the high-level electron energy range may have higher energy values than the mobility edge.

According to one embodiment, a curve of the first number of electron states in the low-level electron energy range and a curve of the second number of electron states in the high-level electron energy range may be discontinuous with each other.

A layer according to one embodiment of the present invention may comprise an amorphous region and a plurality of crystalline regions surrounded by the amorphous region, wherein quantized conduction states may be provided by resonant matching between any first energy state among first energy states of the amorphous region and any second energy state among second energy states of the crystalline regions.

According to one embodiment, each of the crystalline regions may have a nanometer size.

According to one embodiment, the crystalline regions may exhibit a quantum confinement effect.

According to one embodiment, the quantum confinement effect of the crystalline regions may be exhibited in a triaxial direction.

According to one embodiment, the quantized conduction states may be provided at higher electron energy than a mobility edge which is the lowest energy state in which electrons are capable of existing in the conduction band.

According to one embodiment, the plurality of crystalline regions may be randomly distributed in the amorphous region and two-dimensionally arranged.

According to one embodiment, the quantized conduction states may exist in a predetermined energy range.

According to one embodiment, localized states may exist in a higher electron energy range than the predetermined electron energy range.

According to one embodiment, conduction states may exist in a higher electron energy range than an electron energy range corresponding to the non-conduction states.

According to one embodiment, the number of the first energy states may be larger than the number of the second energy states.

According to one embodiment, the resonant matching may provide a number of quantized electron states in a higher energy range than the mobility edge in terms of the density of states (DOS).

According to one embodiment, the resonant matching may provide at least two discrete electron states in a higher energy range than the mobility edge in terms of the density of states (DOS).

According to one embodiment, the quantized conduction states allow limited carrier movement in a predetermined energy range.

A multilevel element according to one embodiment of the present invention may comprise: a gate electrode; a first active layer formed over one side of the gate electrode; a second active layer formed over one side of the first active layer; source and drain electrodes; and a bather layer configured to separate the first active layer from the second active layer, wherein the number of active layers, in which a channel is formed, including the first and second active layers, may be controlled according to the magnitude of a gate voltage which is applied to the gate electrode.

According to one embodiment, the distance between the first active layer and the gate electrode may be shorter than the distance between the second active layer and the gate electrode.

According to one embodiment, the first active layer, the bather layer and the second active layer may be sequentially deposited.

According to one embodiment, the gate electrode may be divided into a first gate voltage range, a second gate voltage range and a third gate voltage range, wherein the first, second and third gate voltage ranges may occur in the order in which the gate voltage increases.

According to one embodiment, when the gate voltage in the first gate voltage range is applied to the gate electrode, only the first active layer may be activated, and when the gate voltage in the third gate voltage range is applied to the gate electrode, the first and second active layers may be activated.

According to one embodiment, when the gate electrode in the second gate voltage range is applied to the gate electrode, only the first active layer may be activated, and an increase in the magnitude of current flowing through the first active layer, which results from an increase in the gate voltage in the second gate voltage range, may be greater than an increase in the magnitude of current flowing through the first active layer, which results from an increase in the gate voltage in the first gate voltage range.

According to one embodiment, the amount of current flowing through the first active layer may be constant even when the gate voltage in the second gate voltage range increases.

According to one embodiment, the first active layer may be in a saturation state in the second gate voltage range.

According to one embodiment, the bather layer comprises a first bather layer provided between the first and second active layers, and a third bather layer provided on the second active layer, wherein the source and drain electrodes may be in contact with the third bather layer.

According to one embodiment, when the gate voltage in the second gate voltage range is applied to the gate electrode, a field which is applied from the gate electrode to the second active layer may be shielded by a current flowing through the first active layer.

According to one embodiment, the source and drain electrodes may be in contact with only one of the first and second active layers.

According to one embodiment, the source and drain electrodes may not be in contact with the first and second active layers.

According to one embodiment, the multilevel element may further comprise a bather layer between the gate electrode and the first active layer, wherein the bather layer between the gate electrode and the first active layer, the first active layer, and the bather layer configured to separate the first active layer from the second active layer, may form a quantum well.

According to one embodiment, at least one of the first and second active layer may exhibit a first number of electron states in a low-level electron energy range in a conduction band, and exhibits a second number of electron states in a high-level electron energy range higher than the low-level electron energy level in the conduction band, wherein localized states may exist between the low-level electron energy range and the high-level electron energy level.

According to one embodiment, the first number of electron states may have a normal distribution with respect to an electron energy value at which the number of electron states in the low-level electron energy range is maximal.

According to one embodiment, at least one of the first and second active layer may comprise an amorphous region and a plurality of crystalline regions surrounded by the amorphous region, wherein quantized conduction states may be provided by matching between any first energy state among first energy states of the amorphous region and any second energy state among second energy states of the crystalline regions.

According to one embodiment, the quantized conduction states may allow limited current flow between the source and drain electrodes, when the gate voltage which is applied to the gate electrode in a predetermined voltage range.

A method of fabricating a multilevel element according to one embodiment of the present invention may comprise the steps of: forming a first active layer over a substrate in a state in which the substrate is prepared in a chamber; forming a bather layer; and forming a second active layer; wherein at least one of the step of forming the first active layer and the step of forming the second active layer may comprise: a source gas dosing/pressurizing step of dosing a metal precursor source gas comprising a metal precursor into the chamber in a state in which an outlet of the chamber is closed, thereby increasing the pressure in the chamber and adsorbing the source gas onto the substrate in the closed chamber; a first main purging step of purging the chamber, after the source gas dosing/pressurizing step; a reactive gas dosing step of dosing a reactive gas into the chamber, after the first main purging step; and a second main purging step of purging the chamber, after the reactive gas dosing step.

According to one embodiment, the source gas dosing/pressurizing step may further comprise the steps of: increasing the pressure in the chamber to a predetermined pressure by dosing the source gas; and maintaining the predetermined pressure by closing an inlet of the chamber.

According to one embodiment, the source gas dosing/pressurizing step may comprise at least two sub-dosing/pressurizing steps and a sub-purging step between the at least two sub-dosing/pressurizing steps.

According to one embodiment, the thickness of the active layer formed by the step of forming the first active layer may be greater than 1.5 nm.

According to one embodiment, the method may further comprise a step of forming source and drain electrodes which are in contact with the second active layer.

According to one embodiment, the method may further comprise the steps of: forming a bather layer on the second active layer; and forming source and drain electrodes which are in contact with the bather layer on the second active layer.

A method of driving a multilevel element according to one embodiment of the present invention may comprise: a first step of applying a gate voltage in a first gate voltage range to a gate electrode, thereby activating a first active layer; a second step of applying to the gate electrode a gate voltage in a second gate voltage range, which is higher than the gate voltage in the first gate voltage range; and applying to the gate electrode a gate voltage in a third gate voltage range, which is higher than the gate electrode in the second gate voltage range, thereby activating first and second active layers.

According to one embodiment, in the second step, the first active layer may be maintained in an activated state, and the second active layer may be in a non-activated state.

According to one embodiment, in the second step, activation of the second active layer may be shielded by a current flowing through the first active layer.

Advantageous Effects

A layer according to one embodiment of the present invention may exhibit a quantized energy state in the energy range higher than the mobility edge.

A layer according to one embodiment of the present invention may exhibit discrete localized states in the energy range higher than the mobility edge.

A layer according to one embodiment of the present invention may exhibit limited carrier mobility in the energy range higher than the mobility edge.

A layer according to one embodiment of the present invention may exhibit resonance energy matching.

A multilevel element and a driving method thereof according to one embodiment of the present invention may exhibit multilevel conduction characteristics.

A multilevel element and a driving method thereof according to one embodiment of the present invention may have at least two turn-on voltages.

A multilevel element and a driving method thereof according to one embodiment of the present invention may exhibit a constant source/drain current even when a gate voltage is swept.

A multilevel element and a driving method thereof according to one embodiment of the present invention may exhibit high stability.

A method of fabricating a multilevel element according to one embodiment of the present invention may be performed through a low-temperature process.

A method of fabricating a multilevel element according to one embodiment of the present invention may provide an environment in which thickness control is easy.

The technical effects of the present invention are not limited to the above-mentioned effects, and other effects of the present invention will be clearly understood by those skilled in the art from the following description.

DESCRIPTION OF DRAWINGS

FIG. 1 illustrates a multilevel element according to one embodiment of the present invention.

FIGS. 2 and 3 illustrate a multilevel active layer according to one embodiment of the present invention.

FIG. 4 illustrates multilevel driving according to one embodiment of the present invention.

FIGS. 5(a)-5(c) illustrate a shielding effect according to one embodiment of the present invention.

FIGS. 6 to 10(a)-10(d) illustrate a multilevel mechanism according to one embodiment of the present invention.

FIGS. 11 and 12 illustrate a first modified embodiment of the present invention.

FIGS. 13 and 14 illustrate a second modified embodiment of the present invention.

FIG. 15 is a flow chart illustrating a method of fabricating a multilevel element according to one embodiment of the present invention.

FIG. 16 is a flow chart illustrating in detail step S120 according to one embodiment of the present invention.

FIGS. 17 and 18 illustrate in detail step S210 according to one embodiment of the present invention.

FIG. 19 shows process conditions for a multilevel element, used in an experimental example of the present invention.

FIG. 20 shows a TEM image of an active layer, obtained in an experimental example of the present invention.

FIGS. 21(a)-21(b) show the I-V characteristics of a multilevel element fabricated according to one embodiment of the present invention.

FIGS. 22 and 23 show the I-V characteristics of multilevel elements fabricated according to modified embodiments of the present invention.

FIGS. 24(a)-24(d) show the results of measuring PET characteristics depending on the thickness of an active layer according to one embodiment of the present invention.

FIG. 25 shows the results of testing the reliability of a multilevel element fabricated according to one embodiment of the present invention.

BEST MODE

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, when any element is referred to as being "on" other element, it means that the element may be formed directly on the other element, or that a third element may be interposed therebetween. In the drawings, the thicknesses of layers and regions may have been exaggerated in order to clearly illustrate features of the embodiments.

In addition, although the terms 'first', 'second', "third" etc. may be used to describe various elements in various embodiments of the present invention, these elements should not be limited by these terms. These terms are only used to distinguish any element from other element. Thus, a first element mentioned in any one embodiment may be termed a second element in other embodiment. Each embodiment described and exemplified herein also includes a complementary embodiment thereof. As used herein, the term "and/or" is meant to include at least one of components listed before and after the term "and/or".

In the specification, singular expressions include plural expressions unless specified otherwise in the context thereof. In addition, the terms "comprise", "have", etc., are intended to denote the existence of mentioned characteristics, numbers, steps, elements, components, or combinations thereof, but do not exclude the probability of existence or addition of one or more other characteristics, numbers, steps, elements, components, or combinations thereof. As used herein, the term "connecting" includes connecting a plurality of elements both directly and indirectly.

Furthermore, in the following description, detailed description of related known functions and configurations will be omitted when it may unnecessarily obscure the subject matter of the present invention.

FIG. 1 illustrates a multilevel element according to one embodiment of the present invention, and FIGS. 2 and 3 illustrate a multilevel active layer according to one embodiment of the present invention.

A multilevel element according to one embodiment of the present invention does not mean a conventional element having the binary states (0 and 1), but may mean an element having ternary or higher states (0, 1 and 2, or 0, 1 and 2 and greater than 2). Namely, a conventional element may have only two states (on and off), whereas a multilevel element according to one embodiment of the present invention may have a third state in addition to the "on" and "off" states. Hereinafter, a multilevel element according to one embodiment of the present invention will be described with reference to FIG. 1.

Referring to FIG. 1, a multilevel element 100 according to one embodiment may comprise at least one of a substrate 110, a gate electrode 120, an insulating layer 130, an active structure 135, and source and drain electrodes 180 and 185.

The substrate 110 is not limited to any particular type, and may comprise at least one of a silicon substrate, a glass substrate and a flexible substrate, for example.

The gate electrode 120 is configured to receive a gate voltage, and may be made of a conductive material, for example, a metal material.

The insulating layer 130 functions as a dielectric layer, and may be made of at least of a silicon-based dielectric material and a metal oxide-based dielectric material, for example. The thickness of the insulating layer 130 may be determined according to the operating range of the gate voltage applied. For example, when the operating range of the gate voltage is low, the thickness of the insulating layer 130 may be thinner than when the operating range of the gate voltage is high.

The active structure 15 may comprise at least one active layer and at least one bather layer. The active layer and the bather layer may be alternately deposited. In this case, the active layer may be at least two in number, and the bather may be deposited in contact with at least one of both sides of the active layer.

For example, as shown in FIG. 1, when a first active layer 150 and a second active layer 170 are provided, a first bather layer 140 may be provided between the insulating layer 130 and the first active layer 150, and a second bather layer 160 may be provided between the first active layer 150 and the second active layer 170. In this case, the gate electrode 120, the insulating layer 130, the first bather layer 140, the first active layer 150, the second bather layer 160 and the second active layer 170 may be sequentially deposited in that order.

Here, the thickness of the active layer may increase as its distance from the gate electrode 120 increases. Unlike this, the thickness of the active layer may also be constant regardless of its distance from the gate electrode 120.

According to one example, each of the first bather layer 140, the first active layer 150, the second bather layer 160 and the second active layer 170 may have a thickness of a few nm. Namely, the active structure 135 may be an ultrathin structure.

According to one example, as shown in FIGS. 2 and 3, at least one of the first and second active layers 150 and 170 may be composed of a layer including an amorphous region (AM_R) and a plurality of crystalline regions (NC_R) surrounded by the amorphous region (AM_R). Namely, in the active layer, the amorphous region (AM_R) and the crystalline regions (NC_R) may be present together.

In this case, each of the crystalline regions (NC_R) has a nanometer size and may have a quantum confinement effect. Specifically, the crystalline regions (NC_R) may have a size of a few nm, for example, about 3 nm, and the average distance between the crystalline regions may be about 2.5 nm. In other words, the crystalline regions (NC_R) may be spaced apart from one another at an average distance of about 2.5 nm, and may have island shapes surrounded by the amorphous region (AM_R). In addition, the crystalline regions (NC_R) may be randomly distributed in a two-dimensional plane in the amorphous region (AM_R). Accordingly, the crystalline regions (NC_R) may exhibit a quantum confinement effect in a triaxial direction. Namely, the crystalline regions (NC_R) may exhibit not only in a thickness direction but also in a plane direction.

Multilevel characteristics may be provided by the active layer structure, and detailed description thereof will be provided below.

According to on example, at least one of the active layers 150 and 170 may comprise a metal oxide, for example. When the active layer comprises a metal oxide, the metal oxide may be zinc oxide (ZnO).

At least one of the first and second bather layers 140 and 160 may comprise at least one of an organic material, an inorganic material, and an organic-inorganic composite material. When the bather layer comprises an organic material, the organic material may be 4MP (4-mercaptophenol), and when the bather layer comprises an organic-inorganic composite material, the organic-inorganic composite material may be 4MP with an Al linker, that is, Al4MP.

The bather layer may protect the active layer. For example, when other layer is formed after formation of the first active layer 150, the second bather layer 160 may prevent the first active layer 150 from being unintentionally doped or prevent a precursor for deposition of the other layer from penetrating into the first active layer 150.

According to one embodiment, the active layer and the bather layer adjacent to the active layer may form a super-lattice structure with each other. The super-lattice structure may increase stability.

According to one embodiment, the bather layer may form an interface with the active layer, and thus the bather layer may form a quantum well with respect to the active layer. Detailed description thereof will be provided later.

The source and drain electrodes 180 and 185 may be in contact with the uppermost active layer or the uppermost bather layer. If the uppermost portion of the active structure 135 is the second active layer 170 as shown in FIG. 1, the source and drain electrodes 180 and 185 may be in contact with the second active layer 170. In this case, the source and drain electrodes 180 and 185 may not be in contact with an active layer other than the second active layer 170 and with the bather layer. The case in which the source and drain electrodes 180 and 185 are in contact with the uppermost bather layer will be described later.

A current may flow between the source and the drain electrodes 180 and 185 depending on the degree of activation of the active layer. According to one example, when the first active layer 150 is activated, a current may flow from the source electrode 180 to the drain electrode 185, and electrons from the source electrode 180 may sequentially tunnel through the second active layer 170 and the second bather layer 160, and then flow along the first active layer 150. The electrodes that passed through the first active layer 150 may sequentially tunnel through the second bather layer 160 and the second active layer 170, and then may be supplied to the drain electrode 185. In addition, when the second active layer 170 is activated, a current may flow from the source electrode 180 through the second active layer 170 to the drain electrode 185.

The multilevel element according to one embodiment of the present invention has been described above with reference to FIGS. 1 to 3. Hereinafter, a method of deriving the multilevel element according to one embodiment of the present invention will be described with reference to FIGS. 4 and 5(*a*)-5(*c*).

FIG. 4 illustrates multilevel driving according to one embodiment of the present invention, and FIGS. 5(*a*)-5(*c*) illustrate a shielding effect according to one embodiment of the present invention. The method of multilevel driving according to one embodiment of the present invention may be implemented by the multilevel element described above with reference to FIGS. 1 to 3.

Referring to FIG. 4, the multilevel element according to one embodiment of the present invention may have multilevel conduction characteristics. In another aspect, the multilevel element according to one embodiment of the present invention may have a plurality of turn-on voltages. For example, a gate voltage that is applied to the gate electrode 120 may be divided into a first gate voltage range (R1), a second gate voltage range (R2), and a third gate voltage range (R3). As shown in FIG. 4, the second gate voltage range (R2) may have a higher voltage value than that of the first gate voltage range (R1). Furthermore, the third gate voltage range (R3) may have a higher voltage value than the second gate voltage range (R2). Hereinafter, I-V curve characteristics depending on the driving voltage in each gate voltage range will be described.

First, the lowest gate voltage in the first gate voltage range (R1) may become a first turn-on voltage. When the first turn-on voltage is applied to the gate electrode 120, the first active layer 150 may be activated, that is, turned-on. Accordingly, a current may flow between the source electrode 180 and the drain electrode 185. At this time, the second active layer 170 may be in a non-activated state, that is, a turn-off state. Next, the magnitude of the current flowing between the source and drain electrodes 180 and 185 may increase as the voltage in the first gate voltage range (R1) increases. Namely, as the gate voltage in the first gate electrode range (R1) increases, the current ratio between the source and drain electrodes may increase with a first slope.

For convenience of explanation, the application of the gate voltage in the second gate voltage range (R2) will be described later, and the application of the gate voltage in the third gate voltage range (R3) will be described first. When a gate voltage in the third gate voltage range (R3) higher than the first and second gate voltages ranges (R1) and (R2) is applied, not only the first active layer 150 but also the second active layer 170 may be turned-on. Namely, the lowest gate voltage in the third gate voltage range (R3) may become a second turn-on voltage. Accordingly, a current may flow between the source and drain electrodes 180 and 185. In the third gate voltage range (R3), unlike the first gate voltage range (R1), the first and second active layers 150 and 170 are all in an activated state, and hence when the first gate voltage range (R1) is applied, a larger amount of current may flow between the source and drain electrodes 180 and 185. As the gate voltage in the third gate voltage range (R3) increases, the magnitude of the current flowing between the source and drain electrodes 180 and 185 may increase with a third slope. Namely, as the gate voltage in the third gate voltage range (R3) increases, the current ratio may increase with a third slope.

When the gate voltage in the second gate voltage range (R2), which is higher than the first gate voltage range (R1) and lower than the third gate voltage range (R3), is applied to the gate electrode 120, only the first active layer 150 may be in an activated state, that is a turn-on state. At this time, the magnitude of the current flowing between the source and drain electrodes 180 and 185 may be maintained even when the gate electrode in the second gate voltage range (R2) increases. Namely, as the gate voltage in the first gate voltage range (R1) increases, the magnitude of the current flowing between the source and drain electrodes 180 and 185 may increase with a first slope, for example, whereas, as the gate voltage in the second gate voltage range (R2), the magnitude of the current flowing between the source and drain electrodes 180 and 185 may change less than the first slope. More specifically, when the gate voltage in the second gate voltage range (R2) increases, the magnitude of the current flowing between the source and drain electrodes 180 and 185 may be constant. In other words, the second slope may be 0. This means that when the gate voltage in the second gate voltage range (R2) is applied to the gate electrode (120), the amount of current flowing through the first active layer 150 is in a saturated state. That is, the second gate voltage range (R2) can be understood to be an intermediate voltage range in that the current is maintained even when the gate voltage in the second gate voltage range R2 increases.

Hereinafter, selective activation of the active layer depending on the gate voltage range will be described with reference to FIGS. 5(*a*)-(*c*).

As described above, when the gate electrode in the first gate voltage range (R1) is applied, a gate field (GF) may be applied to the first active layer 150 as shown in FIG. 5(*a*). Accordingly, the first active layer 150 may be turned-on.

When the gate voltage in the second gate voltage range (R2) is applied, as shown in FIG. 5(*b*), the field induced by the gate voltage is shielded without reaching the second active layer 160 due to the current flowing through the first active layer 150 (shielding effect). At this time, the bather layer also delays the gate voltage reaching the second active layer 170. Furthermore, when the gate voltage in the second gate voltage range (R2) is applied, the current between the source and drain electrodes 180 and 185 flows constantly due to saturation of the first active layer 150, even when the gate voltage is increased. In another aspect, even when the gate voltage in the second gate voltage range (R2) increases, the bather layers 140 and 160 may delay gating of the second active layer 170 and maintain limited electron flow through the first active layer 150.

When the gate voltage in the third gate voltage range (R3) is applied, the gate voltage reaches the second active layer 170 due to field penetration as shown in FIG. 5(c). Accordingly, the second active layer 170 may be turned-on.

In the description of the shielding effect, the occurrence of the shielding effect in the second gate voltage range (R2) has been described above, it should be understood that the multishielding effect may also occur in the first gate voltage range (R1).

In summary, when the gate voltage in the first gate voltage range (R1) is applied to the gate electrode 120, only the first active layer 150 may be activated, and the second active layer 170 may not be activated. Then, when the gate voltage in the second gate voltage range (R2) higher than the first gate voltage range (R2) is applied, the first active layer 150 may be maintained in an activated state, but the current flowing through the first active layer 150 can reach a saturated state. In addition, the second active layer 170 may be still in a non-activated state. Next, when the gate voltage in the third gate voltage range (R3) higher than the second gate voltage range (R2) is applied, the first and second active layers 150 and 170 may all be activated.

Accordingly, the multilevel element according to one embodiment of the present invention may have a plurality of turn-on voltages. Namely, the multilevel element according to one embodiment of the present invention may exhibit multilevel conduction characteristics, because it may have the second gate voltage range that does not occur in conventional elements, that is, a gate voltage range that has no effect on the magnitude of current even when the gate voltage increases.

According to one embodiment, the thickness of the active layer may be in the range in which FET (Field Effect Transistor) characteristics appear. For example, when the active layer comprises zinc oxide, it may have a thickness greater than 1.5 nm. If the thickness of the zinc oxide is smaller than 1.5 nm, the zinc oxide may lose PET characteristics. In addition, the thickness of the active layer may be 20 nm or less. If the thickness of the active layer is greater than 20 nm, the magnitude of the current flowing through the first active layer 150 will increase. This increases the shielding effect of the first active layer 150 that prevents the gate voltage from penetrating into the second active layer 170 by field penetration. In this case, an excessively high gate voltage is required to turn on the second active layer 170, which is disadvantageous in terms of power consumption. In addition, the gate insulating film 130 should be thicker in order to withstand a high gate voltage, and this thick thickness does not meet the down-scaling trend of transistors. On the other hand, when the thickness of the first active layer 150 is 20 nm or less, the second active layer 170 can be turned on even in a general gate voltage range, and thus this thickness is advantageous in terms of power consumption and can meet the miniaturization trend.

The characteristics of the multilevel element according to one embodiment of the present invention have been described above with reference to FIGS. 4 and 5. Hereinafter, a multilevel mechanism according to one embodiment of the present invention will be described with reference to FIGS. 6 to 10.

FIGS. 6 to 10 illustrate a multilevel mechanism according to one embodiment of the present invention. Specifically, FIG. 6 illustrates resonant energy matching according to one embodiment of the present invention; FIG. 7 illustrates the density of states (DOS) according to one embodiment of the present invention; FIGS. 8(a)-8(c) illustrates the density of states (DOS) of a crystalline layer, an amorphous layer and an active layer according to one embodiment of the present invention; FIGS. 9(a)-9(d) illustrate a wave function according to one embodiment of the present invention; and FIGS. 10(a)-10(d) illustrate a multilevel element according to one embodiment of the present invention in terms of energy bands.

As described above with reference to FIG. 4, the multilevel element according to one embodiment of the present invention may have the second gate voltage range (R2) in which an increase in the gate voltage has no effect on current flow. Since the multilevel element may be implemented by the second gate voltage range (R2), a multilevel mechanism will be explained based on the first and second active layers 150 and 170 that generate the second gate voltage range (R2). For convenience, the explanation will be based on the first active layer 150, but it goes without saying that the technical idea of the present invention can also be applied to other active layers, for example, the second active layer 170.

As described above, the first active layer 150 according to one embodiment of the present invention may be composed of a layer including an amorphous region (AM_R) and a plurality of crystalline regions (NC_R) surrounded by the amorphous region (AM_R).

Referring to FIG. 6, the amorphous region (AM_R) of the first active layer 150 may have a large number of localized states. Unlike this, the crystalline regions (NC_R) of the first active layer 150 may have a smaller number of discrete localized states than the localized states of the amorphous region (AM_R). In this case, there may be resonant energy matching between a specific energy state (AM_E) among the localized energy states of the amorphous region (AM_R) and a specific energy state (NC_E) among the localized energy states of the crystalline regions (NC_R).

Hybridization caused by the resonant energy matching may provide quantized conduction states. The quantized conduction states may exhibit limited current flow while showing conduction states. The quantized conduction states will now be described in more detail with reference to FIGS. 7 and 8(a).

FIGS. 7 and 8(a) show the density of states (DOS) according to one embodiment of the present invention. For reference, the results of DOS simulation can be obtained by performing calculation on a formed active layer by PBE (Perdew-Burke-Ernzerhof) exchange-correlation functional and PAW (projector-augmented wave) pseudopotentials methods using the VASP (Vienna ab initio simulation) program.

DOS in FIGS. 7 and 8(a) indicates the change in the number of electron states by an increase in electron energy. As shown in FIG. 7, the first active layer 150 may have a valence band and a conduction band.

The valence balance may be divided into an extended state (non-localized state) and a localized state by a mobility edge. In addition, the conduction band may also be divided into an extended state and a localized state by a mobility edge. Here, the definition of the mobility edge will be described later with reference to FIG. 8(c).

As shown in FIGS. 7 and 8(a), the first active layer 150 according to one embodiment of the present invention may exhibit a first number of electron states in a low-level electron energy range (about 2.8 eV to 2.9 eV) in the conduction band, and exhibit a second number of electron states in a high-level electron energy range (about 3.2 eV or higher) higher than the low-level electron energy range in the conduction band.

At this time, a curve of the first electron state number in the low-level electron energy range and a curve of the second electron state number in the high-level electron energy range may be discontinuous with each other. In other words, the maximum electron energy value (about 2.9 eV) in the low-level electron energy range may be smaller than the minimum electron energy value (about 3.2 eV) in the high-level electron energy range. Here, the maximum value of the first electron state number in the low-level electron energy range may be smaller than the minimum value of the second electron state number in the high-level electron energy range. Furthermore, as shown in FIG. 8(a), the first electron state number may have a normal distribution with respect to an electron energy value at which the number of electron states in the low-level electron energy range is maximum.

According to one embodiment, the low-level electron energy range and the high-level electron energy range can be provided at higher energy than the mobility edge in the conduction band (i.e. mobility edge quantization). This can mean that the energy level of localized states in the amorphous region (AM_R) of the first active layer 150 and the energy level of localized states in the crystalline regions match each other above the mobility edge. Accordingly, the first active layer 150 may exhibit conduction states in the low-level electron energy range and the high-level electron energy range. At this time, the conduction states in the low-level electron energy range having the first electron state number above the mobility edge may be defined as quantized extended states.

In addition, there may be a localized state (i.e., an electron state number of 0) between the low-level electron energy range and the high-level electron energy range. This can mean that the crystalline regions (NC_R) of the active layer have no energy state between the low-level electron energy level and the high-level electron energy level. Accordingly, the resonant energy of the crystalline regions (NC_R) and the resonant energy of the amorphous region (AM_R) do not match each other between the low-level electron energy range and the high-level electron energy level.

According to one embodiment, as described above, the low-level electron energy range may be provided by resonant energy matching between the crystalline regions (NC_R) and amorphous region (AM_R) of the first active layer 150. At this time, the amorphous region (NC_R) has a quantum confinement effect in a triaxial direction, and thus a curve defined by the low-level electron energy range and the first electron state number may have a very limited area. This can mean that a very limited number of carriers can exist.

According to one embodiment, a low-level energy range above the mobility level may be provided by resonant energy matching between the crystalline regions (NC_R) and the amorphous region (AM_R). Unlike this, a conventional active layer comprising only a crystalline region or a conventional active layer comprising only an amorphous region could not exhibit the low-level energy range above the mobility edge according to one embodiment of the present invention.

Specifically, referring to FIG. 8(b), it can only be seen that, in an active layer comprising only a crystalline region, a conduction tail is formed on a band edge, and a continuous single extended state is provided in the conduction band. That is, it can be seen that discrete energy levels are not present in the conduction band.

Referring to FIG. 8(c), it can be seen that, in an active layer comprising only an amorphous region, the conduction band is divided into an extended state and a localized state by the mobility edge. However, it can be seen that the extended state in the conduction band is a single state that is continuously present.

Theoretically, an amorphous region has a number of localized states that interfere with the movement of electrons, due to the Anderson localization. According to the Anderson localization, a conduction band is divided, according to electron energy, into a localized state and a non-localized state. The localized state may have a non-conducting state, and the non-localized state may have a conduction state. At this time, the criterion for dividing the conduction band into the localized state and the non-localized state can be defined as the mobility edge. If electron energy higher than the mobility edge is provided, a wave function can be extended. Accordingly, charge transfer becomes possible. Unlike this, if electron energy lower than the mobility edge is provided, the wave function will be isolated. Accordingly, charge transfer becomes impossible.

In other words, it can be seen that an active layer comprising only an amorphous region has only a single continuous non-localized state above the mobility edge in the conduction band, and thus discrete energy levels are not present in the conduction band.

However, the first active layer 150 according to one embodiment of the present invention can exhibit quantized conduction states by resonant energy matching between the crystalline regions (NC_R) and the amorphous region (AM_R). The quantized conduction states can be confirmed by the presence of the first electron state number in the low-level energy range on the DOS.

According to one embodiment, the quantized conduction states have a limited number of electron states, and thus the second gate voltage range (R2) as described above can be provided. In other words, the low-level energy range has a limited number of carriers that are present above the mobility edge and discontinuous with the high-level energy range, and hence the amount of the current flowing through the first active layer 150 is limited, even when the gate voltage in the second gate voltage range (R2) increases. Accordingly, a first turn-on voltage caused by the first gate voltage range (R1) can be clearly distinguished from a second turn-on voltage caused by the third gate voltage range (R3). Therefore, even if the operating margin of the gate voltage is widened, the error occurrence rate can be reduced.

FIG. 9 illustrates a wave function according to one embodiment of the present invention.

Referring to FIG. 9(a), the state of states in the active layer according to one embodiment of the present invention can be divided into state 1 which is below the mobility edge in the conduction band, state 2 which is in the low-level energy range, and state 3 which is in the high-level energy level.

FIGS. 9(b) to 9(d) show the results of simulating the wave function isosurface according to the divided states shown in FIG. 9(a). The wave function simulation was performed according to the density function theory. The wave function for state 1 is as shown in FIG. 9(b). It can be seen that the wave function is in a localized state that does not overlap other wave function. Unlike this, as shown in FIG. 9(c), the wave function for state 2 partially overlaps along the crystalline regions and the amorphous region. This suggests that state 2 has a conduction state. In addition, as shown in FIG. 9(d), the wave function for state 3 is distributed throughout the active layer. It is expected that the localized state between state and state 3 will have the wave function isosurface as shown in FIG. 9(b).

As described above with reference to FIG. 9, from the viewpoint of the wave function according to each state, it can be confirmed that state 2 has a quantized conduction state.

FIGS. 10(*a*)-10(*d*) illustrate a multilevel element according to one embodiment of the present invention in terms of energy bands.

Referring to FIG. 10(*a*), in the multilevel element 100 according to one embodiment of the present invention, the first bather layer 140, the first active layer 150 and the second bather layer 160 may form a quantum well.

The quantized extended state shown in FIG. 10(*a*) can mean an energy level providing a quantized energy state, generated by resonant energy matching between the crystalline regions (NC_R) and the amorphous region (AM_R) as described above with reference to FIGS. 6, 7 and 8(*a*). The conduction band edge and valence band edge of the first and second bather layers 140 and 160 can be measured by UPS (ultraviolet photoelectron spectroscopy) and DUV (deep ultraviolet).

Referring to FIG. 10(*b*), a gate voltage corresponding to the first gate voltage range (R1) is applied to the gate electrode 120, a current may flow between the source and drain electrodes 180 and 185. As described above, the quantized conduction state can be provided by resonant energy matching between the crystalline regions (NC_R) and amorphous region (AM_R) of the first active layer (150). In other words, as described above with reference to FIGS. 7 and 8(*a*), the first electron state number in the low-level energy range above the mobility edge is provided, and hence the first active layer 150 can be activated. Accordingly, a current can flow between the source and drain electrodes 180 and 185. In this case, as the gate voltage in the low-level energy range increases, current flow can increase.

Referring to FIG. 10(*c*), when a gate voltage corresponding to the second gate voltage range (R2) is applied to the gate electrode 120, only a limited amount of electrons can pass through the first active layer 150. In other words, in the second gate voltage range (R2), the energy between the low-level energy range and the high-level energy level as described above with reference to FIG. 7 may be provided. In this case, because the low-level energy range has a limited range, the current can be maintained at a constant level without further increasing, even when the gate voltage in the second gate voltage range (R2) increases.

Referring to FIG. 10(*d*), when a gate electrode corresponding to the third gate voltage range (R3) is applied to the gate electrode 120, the second active layer 170 may be activated. Accordingly, current flow through the active layer 170 may be generated through the source and drain electrodes 180 and 185.

In summary, as shown in FIG. 4, the multilevel element according to one embodiment of the present invention has the second gate voltage range in which the current magnitude does not change even when the gate voltage is swept. In other words, the second gate voltage range can be clearly distinguished from the first and third gate voltage ranges. This means that multilevel conduction characteristics are provided by the second gate voltage range.

The mechanism for the second gate voltage range has been described above with reference to FIGS. 6 to 10. In other words, as shown in FIGS. 7 and 8(*a*), the active layer has quantized extended states. In particular, the active layer has quantized extended states above the mobility edge. Since the active layer has "quantized" extended states, it may have a limited number of carriers in a particular gate voltage range.

In other words, in the second gate voltage range, a change in the current flowing through the active layer does not substantially occur. This can mean that, in the second gate voltage range, the maximum amount of current can flow through the active layer due to the already quantized extended states.

Furthermore, in the second gate voltage range, the magnitude of the current flowing through the first active layer does not substantially change, and hence the magnitude of the shielding effect caused by the first active layer also does not substantially change. Thus, when the third gate voltage range higher than the second gate voltage range is applied, the energy amount of the gate field passing through the shield of the first active layer increases. This is because the amount of the shield that blocks the gate field directing from the first active layer to the second active layer is limited due to the current saturation of the first active layer. Accordingly, in the third gate voltage range, the second active layer may also be gated.

As described above, the multilevel element according to one embodiment of the present invention may provide multilevel conduction characteristics in that it has quantized conduction states above the mobility edge.

In addition, as described above, a unique phenomenon which is the quantized conduction states can be exhibited due to the layer characteristics of the active layer. In other words, a specific energy state among the localized energy states of the amorphous region (AM_R) of the active layer may match the resonant energy of a specific energy state among the localized energy states of the crystalline regions (NC_R). Due to hybridization caused by the resonant energy matching, quantized conduction states can be provided.

However, the fact that the quantized conduction states can be exhibited by the resonant energy matching is merely one example, and it goes without saying that quantized conduction states can be exhibited by other method.

The multilevel mechanism according to one embodiment of the present invention has been described above with reference to FIGS. 6 to 10. Hereinafter, a first modified embodiment of the present invention will be described with reference to FIGS. 11 and 12.

FIGS. 11 and 12 illustrate a first modified embodiment of the present invention. In the description of the first modified embodiment, the description of the contents overlapping with those described above will be omitted.

Referring to FIG. 11, a multilevel element according to the first modified embodiment of the present invention may further comprise a third bather layer 172 on the second active layer 170. In this case, the source and drain electrodes 180 and 185 may be in contact with the third bather layer 172. In other words, the source and drain electrodes 180 and 185 may not be in contact with the first bather layer 140, the first active layer 150, the second bather layer 160, and the second active layer 170. According to the above-described embodiment, the source and drain electrodes 180 and 185 are contact in contact with the second active layer 170, but in the first modified embodiment, the source and drain electrodes 180 and 185 may be in contact with the third bather layer 172.

As shown in FIG. 12, in the first modified embodiment, the source and drain electrodes 180 and 185 are in contact with the third bather layer 172, and hence the first to fourth gate voltage ranges (R1 to R4) may be provided. In other words, the second active layer 170 may also provide a quantum well having quantized conduction states by the second and third bather layers 160 and 172. Accordingly, the current flowing between the source and drain electrodes 180 and 185 may be maintained at a constant level, even when the gate voltage in the fourth gate voltage range (R4) increases.

The first modified embodiment of the present invention has been described above with reference to FIGS. 11 and 12. Hereinafter, a second modified embodiment of the present invention will be described with reference to FIGS. 13 and 14.

FIGS. 13 and 14 illustrate a second modified embodiment of the present invention. In the description of the second modified embodiment, the description of the contents overlapping with those of the first modified embodiment will be omitted.

Referring to FIG. 13, a third active layer 174 may further be provided on the third bather layer 172. In addition, the source and drain electrodes 180 and 185 may be in contact with the third active layer 174. In other words, the source and drain electrodes 180 and 185 may not be in contact with the first bather layer 140, the first active layer 150, the second bather layer 160, the second active layer 170 and the third bather layer 172. Thus, in the second modified embodiment, the source and drain electrodes 180 and 185 may be in contact with the third active layer 174, unlike the first modified embodiment.

As shown in FIG. 14, in the second modified embodiment, the third active layer 174 is provided, and hence the first to fifth gate voltage ranges (R1 to R5) may be provided. In other words, in the second and fourth gate voltage ranges (R2 and R4), current saturation by quantized conduction states may occur, and in the fifth gate voltage range (R5), the current may increase due to the contact between the third active layer 174 and the source/drain electrodes 180 and 185.

The embodiment and modified embodiments of the present invention have been described above. Hereinafter, a method of fabricating a multilevel element according to one embodiment of the present invention will be described with reference to FIGS. 15 to 18.

FIG. 15 is a flow chart illustrating a method of fabricating a multilevel element according to one embodiment of the present invention, and FIGS. 16 to 18 illustrate in detail step S210 according to one embodiment of the present invention.

Referring to FIG. 15, a method of fabricating a multilevel element according to one embodiment of the present invention may comprise at least one of step (S110) of forming a first bather layer, step (S120) of forming a first active layer, step (S130) of forming a second bather layer, and step (S140) of forming a second active layer. Hereinafter, each of the steps will be described in detail.

Step S110

Step S110 is a preparation step, and may comprise the steps of: preparing a substrate; forming a gate electrode on the substrate; and forming a gate insulating layer on the gate electrode.

On the gate insulating layer may be formed a first bather layer. The first bather layer may be formed by a molecular layer deposition (MLD) method. For example, when Al4MP is deposited by the molecular layer deposition method, the molecular layer deposition method may comprising a TMA (trimethylaluminum) precursor dosing step, a purging step, a 4MP precursor dosing step, and a purging step.

As a result, a first bather layer 140 may be deposited.

Step S120

In step S120, a first active layer 150 may be deposited. Step S120 will be described in detail with reference to FIG. 16.

FIG. 16 is a flow chart illustrating in detail step S120 according to one embodiment of the present invention.

Referring to FIG. 16, a method of forming a first active layer according to one embodiment of the present invention may comprise at least one of a source gas dosing/pressurizing step (S210), a first main purging step (S220), a reactive gas dosing step (S230), and a second main purging step (S240). Hereinafter, each of the steps will be described in detail.

Step S210

For the source gas dosing/pressurizing step (S210), a source gas may be prepared. The kind of source gas to be prepared may vary depending on the type of layer to be deposited. For example, when a layer to be deposited is a metal oxide layer, a metal precursor source gas corresponding thereto may be prepared. For example, when a layer to be deposited is a zinc oxide (ZnO) layer, the source gas may comprise DEZ (diethyl zinc).

The source gas may be dosed into a chamber in a state in which the chamber outlet is closed. Accordingly, as the source gas is introduced into the chamber, the pressure in the chamber can increase. In other words, the pressure in the chamber is increased by dosing of the source gas, and hence the source gas may be adsorbed onto a substrate in a pressurized atmosphere. In addition, the increased pressure in the chamber may be maintained for a predetermined time. Accordingly, the efficiency of adsorption onto the substrate can be increased.

At this time, the increased pressure in step S210 may be higher than 0.03 Torr, preferably, 0.1 Torr or higher, and more preferably 0.3 Torr or higher. In addition, step S210 may be performed at a temperature of 80° C. to 250° C.

Step S220

In the first main purging step (S220), inert gas may be used. The inert gas may be, for example, argon (Ar) or nitrogen ($N_2$) gas. Through the purging step, an excess of the source gas that has not been absorbed onto the substrate surface may be removed.

Step S230

In the reactive gas dosing step (S230), a reactive gas may react with the source gas to form the layer to be deposited. For example, when the source gas comprises DEZ, the reactive gas may comprise $H_2O$.

Step S240

After the reactive gas dosing step, the second main purging step (S240) may further be performed. This can remove an excess of the gas that has not been adsorbed onto the substrate surface.

Step S210 to step S240 according to one embodiment of the present invention have been described above. Hereinafter, dosing/pressurizing of step S110 will be described in detail.

Dosing/Pressurizing of Step S210

The source gas dosing/pressurizing step (step S210) may be performed in a pressurized atmosphere. In other words, the source gas dosing/pressurizing step may be performed in a high-pressure atmosphere, and may be abbreviated as "pressurizing step".

Although the source gas dosing/pressurizing step (step S210) will be described in detail for the sake of brevity, it should be understood that dosing/pressurizing may also be performed in the reactive gas dosing step (step S230).

According to one embodiment, the dosing/pressurizing step may be performed in a state in which a chamber having a substrate loaded therein is closed. For example, the discharge valve of a chamber is closed, and in this state, a metal precursor source gas may be dosed into the chamber (sub-dosing/pressurizing step), thereby inducing high pressure in the chamber. The induced high pressure may be maintained (sub-exposure step). When the high pressure is maintained for a predetermined time, the metal precursor source gas may be adsorbed onto the substrate surface in a high-pressure atmosphere.

In other words, the dosing/pressurizing step may comprise at least one of a sub-dosing/pressurizing step, a sub-exposure step and a sub-purging step. The sub-dosing/pressurizing step may be defined as a step of dosing the source gas into the chamber in a state in which the outlet of the chamber is closed, thereby causing the pressure in the chamber to reach a predetermined pressure. The sub-exposure step is a step of maintaining the predetermined pressure provided by the sub-dosing/pressurizing step. To this end, the inlet and outlet of the chamber may all be closed. Namely, the chamber may be closed. The sub-purging step may be performed after the sub-exposure step to remove an excess of the source gas dosed.

As shown in FIG. 17, the pressure in the sub-exposure step may be maintained at a constant level, even when the number of the sub-exposure steps increases. Unlike this, as shown in FIG. 18, the pressure in the sub-exposure step may increase as the number of the sub-exposure steps increases. For reference, the Y-axis in FIG. 17 represents pressure, and the X-axis represents process steps.

According to one embodiment, step S210 may be performed at a temperature of 80° C. to 250° C.

In addition, sub-steps of step S110 may be performed at the same temperature. In particular, these sub-steps may be performed at low temperature. As used herein, the term "low temperature" refers to a temperature of 250° C. or below, preferably 80° C. to 250° C.

Through the steps S210 to S240 described above, the first active layer 150 may be deposited. At this time, the thickness of the layer deposited may be controlled depending on the number of repetition of steps S210 to S240. For example, when the layer to be deposited is a zinc oxide layer, steps S210 to S240 may be repeated such that the thickness of the layer exceeds 1.5 nm. In addition, when the layer to be deposited is a zinc oxide layer, steps S210 to S240 may be repeated such that the thickness of the layer is 20 nm or less.

The active layer formed according to steps S210 to S240 can exhibit the DOS simulation results as shown in FIGS. 7 and 8(a). In other words, the active layer can exhibit quantized conduction states. More specifically, it can exhibit quantized conduction states at energy higher than the mobility edge. As described above, the DOS simulation results can be obtained by performing calculation on the formed active layer by the PBE (Perdew-Burke-Ernzerhof) exchange-correlation functional and PAW (projector-augmented wave) pseudopotentials methods using the VASP (Vienna ab initio simulation) program.

Step S130

Referring to FIG. 15 again, a second bather layer 160 may be deposited on the first active layer 150. Step S130 corresponds to the above-described step S110, and thus the detailed description thereof will be omitted.

Step S140

On the second bather layer 160, a second active layer 170 may be deposited. Here, step S140 corresponds to the above-described step S120, and thus the detailed description thereof will be omitted.

On the second active layer 170, source and drain electrodes 180 and 185 may be deposited. As a result, a multilevel element according to one embodiment of the present invention may be fabricated.

Meanwhile, it is needless to say that the modified embodiments of the present invention, described above with reference to FIGS. 11 and 13, can also be performed depending on the number of depositions of the active layer and the number of depositions of the bather layer.

In addition, step S140 may be omitted, and the source and drain electrodes 180 and 185 may be formed on the second bather layer 160 formed in step S130, such that they are in contact with the second bather layer 160.

The methods of fabricating multilevel elements according to one embodiment and modified embodiments of the present invention have been described above with reference to FIGS. 15 to 18. Hereinafter, an experimental example for one embodiment and modified embodiments of the present invention will be described with reference to FIGS. 19 to 24.

FIG. 19 shows process conditions for a multilevel element, used in an experimental example of the present invention. In particular, FIG. 19 shows process conditions for forming an active layer according to one embodiment of the present invention. FIG. 20 shows a TEM image of an active layer, obtained in an experimental example of the present invention, and FIGS. 21(a)-21(b) show the I-V characteristics of a multilevel element fabricated according to one embodiment of the present invention.

EXPERIMENTAL EXAMPLE

In order to fabricate a multilevel element according to an experimental example, a silicon wafer having a thickness of 300 nm was prepared, and an aluminum gate electrode having a thickness of 70 nm was deposited on the silicon wafer. The gate electrode was deposited by thermal vapor deposition. On the gate electrode, aluminum oxide ($Al_2O_3$) as a gate insulating layer was deposited. The aluminum oxide was deposited by an atomic layer deposition process. For deposition of the aluminum oxide, a TMA precursor source gas dosing step, a purging step, a $H_2O$ dosing step and a purging step were sequentially performed. The thickness of the aluminum oxide varied depending on the number of active layers to be deposited. The thickness of the aluminum oxide increased as the number of active layers increased.

According to step S110, on the aluminum oxide as a gate insulating layer, a first bather layer was deposited. To this end, a TMA source gas was dosed at a temperature of 20° C. for 2 seconds, an argon purge gas was dosed for 20 seconds, 4MP as a reactive gas was dosed at a temperature of 75° C. for 20 seconds, and an argon purge gas was dosed for 200 seconds. As a result, a first bather layer having a thickness of about 9 nm was deposited.

Next, according to step S120 (steps S210 to S240), a first active layer was deposited on the first bather layer. To this end, as shown in FIG. 19, in step S210, $DFZ_2$ was dosed by performing sub-dosing/pressurizing four times. Specifically, in the first sub-dosing/pressurizing step, $DFZ_2$ was dosed into the chamber in which the chamber outlet was closed, thereby increasing the pressure in the chamber to 1.0 Torr. Next, the chamber inlet was also closed, and in this state, $DFZ_2$ was adsorbed onto the substrate by substrate exposure to DEZ for 3 seconds at a pressure of 1.0 Torr (sub-exposure step). Next, sub-purging was performed for 15 seconds. Next, in the second sub-dosing/pressurizing step, DEZ was dosed into the chamber in which the chamber outlet was closed, thereby increasing the pressure in the chamber to 1.0 Torr. Next, the chamber inlet was also closed, and in this state, $DFZ_2$ was adsorbed onto the substrate by substrate exposure to DEZ for 3 seconds at a pressure of 1.0 Torr. In the same manner, the sub-dosing/pressurizing step and the sub-exposure step were repeated four times.

Next, according to step S220, a first main purging step was performed for 15 seconds.

In step S230, $H_2O$ was dosed by performing sub-dosing/pressurizing and sub-exposure four times. In this step, the exposure time was longer than the DFZ, dosing time. This is because the reactive gas $H_2O$ is more likely to aggregate than the source gas DFZ.

Next, according to step S240, purging was performed for 25 seconds.

The process temperature in steps S210 to S240 was about 110° C.

Steps S210 to S240 were repeated, thereby depositing a zinc oxide active layer having a thickness of about 2.5 nm.

Next, according to step S130 and step S140, a second bather layer and a second active layer were deposited. The process conditions of step S130 correspond to those of step S110, and the process conditions of step S140 correspond to those of step S120, and thus the detailed description thereof will be omitted.

Next, source and drain aluminum electrodes were formed to a thickness of 70 nm.

As a result, a multilevel element according to the experimental example of the present invention was fabricated.

The active layer of the multilevel element fabricated according to the experimental example was imaged by TEM. The TEM image is shown in FIG. 20, and as can be seen therein, the active layer comprises a plurality of crystalline regions and an amorphous region surrounding the plurality of crystalline regions. It was confirmed that each of the crystalline regions had a nanometer size, particularly a size of about 3 nm. In addition, it was shown that the distance between adjacent crystalline regions was about 2.5 nm. Furthermore, it was shown that the crystalline regions were randomly distributed in a two-dimensional plane (see FIG. 2).

In this experimental example, the active layer was formed at a low temperature of about 110° C. Namely, the fabrication method of the experimental example can be free from constraints of the process temperature in that an active layer comprising crystalline regions together with an amorphous region can be formed at low temperature.

An I-V curve of the multilevel element fabricated according to the experimental example was measured, and the result is shown in FIG. 21(a). As a result, it was confirmed that the multilevel element fabricated according to the experimental example had the first to third gate voltage ranges (R1 to R3) as described above with reference to FIG. 4.

It was confirmed that the first gate voltage range was from 0.28 V to 1 V. Namely, the first active layer was activated at 0.28 V. The second gate voltage range was found to be 1 V to 2 V. Namely, at a voltage between 1 V and 2 V, the magnitude of current was constant (about 3.9 nA). This is believed to result from resonant energy matching between the energy state of the amorphous region and the energy state of the crystalline regions as described above. Namely, it appears that the magnitude of the current was constant due to the quantized conduction states, even though the magnitude of the voltage changed. The third gate voltage range was confirmed to be 2 V or higher. Namely, it was confirmed that, at a voltage of 2V or higher, the gate field that passed through the first active layer activated even the second active layer. In this case, it is expected that the magnitude of the saturation current in the second gate voltage range can be controlled according to the thickness of the first active layer.

In addition, the multilevel element fabricated according to the experimental example was theoretically modeled. Next, the I-V curve of the multilevel element fabricated according to the experimental example was compared with the I-V curve of the modeled element. As a result, as shown in FIG. 21(b), it can be confirmed that the value of the experimental example and the value of the modeled element are in good agreement with each other.

FIGS. 22 and 23 show the I-V characteristics of multilevel elements fabricated according to the modified embodiments of the present invention.

FIG. 22 shows the I-V characteristics of the multilevel element according to the first modified embodiment of the present invention. In the first modified embodiment, the third bather layer was additionally deposited on the second bather layer, and thus the third bather layer was additionally deposited under the process conditions described above with respect to step S110. Specifically, the third bather layer was additionally deposited under the process conditions described in the experimental example above. The thickness of the third bather layer was about 9 nm.

As shown in FIG. 22, it was confirmed that the multilevel element according to the first modified embodiment had the first to fourth gate voltage ranges (R1 to R4) as described above with reference to FIG. 12.

It was confirmed that the first gate voltage range was from 0.28 V to 3 V. Namely, the first active layer was activated at 0.28 V. The second gate voltage range was confirmed to be 3 V to 8 V. Namely, at a voltage between 3 V and 8 V, the magnitude of current was constant (about 0.021 µA). This is believed to result from resonant energy matching between the energy state of the amorphous region and the energy state of the crystalline regions as described above. Namely, it appears that the magnitude of the current was constant due to the quantized conduction states, even though the magnitude of the voltage changed. The third gate voltage range was confirmed to be 8 V to 15 V. Namely, it was confirmed that, at a voltage of 8 V or higher, the gate field that passed through the first active layer activated even the second active layer. In addition, it was confirmed that the fourth gate voltage range was 15 V or higher. The magnitude of the current in the fourth gate voltage range was found to be about 0.134 µA. It can be seen that, in the fourth gate voltage range, the second active layer was also saturated.

FIG. 23 shows the I-V characteristics of the multilevel element according to the second modified embodiment of the present invention. In the second modified embodiment, the active bather layer was additionally deposited, and thus the third active layer was additionally deposited under the process conditions described above with respect to step S120. Specifically, the third active layer was additionally deposited under the process conditions described in the experimental example above. The thickness of the third active layer was about 2.5 nm.

As shown in FIG. 23, it was confirmed that the multilevel element according to the second modified embodiment had the first gate voltage range (R1), the second gate voltage range (R2), the third gate voltage range (R3), the fourth gate voltage range (R4) and the fifth gate voltage range (R5), as described above with reference to FIG. 14.

It was confirmed that the first gate voltage range was from 0.28 V to 3 V. Namely, the first active layer was activated at 0.28 V. The second gate voltage range was confirmed to be 3 V to 8 V. Namely, at a voltage between 3 V and 8 V, the magnitude of the current was constant (about 0.021 µA). This is believed to result from resonant energy matching between the energy state of the amorphous region and the energy state of the crystalline regions as described above. Namely, it appears that the magnitude of the current was constant due to the quantized conduction states, even though the magnitude of the voltage changed. The third gate voltage range was confirmed to be 8 V to 15 V. Namely, it was confirmed that, at a voltage of 8 V or higher, the gate field that passed through the first active layer activated even the second active layer. In addition, it was confirmed that the fourth gate voltage range was from 15 V to 25 V. The magnitude of the current in the fourth gate voltage range was found to be about 0.134 μA. It can be seen that, in the fourth gate voltage range, the second active layer was also saturated. The fifth gate voltage range was confirmed to be 25 V or higher.

Looking at the I-V curves of the modified embodiments, it can be seen that in the method of fabricating a multilevel element according to one embodiment of the present invention, the number of multilevel states can be easily controlled to 3, 4, . . . n by controlling the number of active layers and bather layers to be deposited.

In addition, when the first modified embodiment was compared with the second modified embodiment, it was confirmed that the magnitude of the current in the last gate voltage range was constant or increased depending on whether the source and drain electrodes would be in contact with the bather layer or whether these electrodes would be in contact with the bather layer. Accordingly, the layer to be in contact with the source and drain electrodes may be selected from among the bather layer and the active layer depending on the desired characteristics of the element.

FIGS. 24(*a*)-24(*d*) show the results of measuring PET characteristics depending on the thickness of the active layer according to one embodiment of the present invention. Specifically, FIGS. 24(*a*)-24(*d*) show the results of measuring PET characteristics depending on the thickness of the active layer deposited under the process conditions described above with reference to FIGS. 24(*a*)-24(*d*).

For measurement of PET characteristics, transistors were fabricated, which each comprises a substrate, a gate electrode, a gate insulating layer, an active layer comprising zinc oxide, and source and drain electrodes.

Specifically, transistors having zinc oxide active layer thicknesses of 1.5 nm, 3 nm, 4 nm, 5 nm, 6 nm, 7 nm 8 nm, 9 nm and 10 nm, respectively, were fabricated while increasing the number of repetition of the active layer deposition step described above with respect to FIG. 19.

Referring to FIGS. 24(*a*)-24(*d*), it can be seen that when the thickness of the metal oxide layer is 1.5 nm, no PET (field effect transistor) characteristic appeared. Hence, it is preferable that the thickness of the metal oxide layer be greater than 1.5 nm in view of the PET characteristics. When the thickness of the metal oxide layer is greater than 1.5 nm, it can be seen that stable PET characteristics appear. Namely, when the thickness of the metal oxide layer is greater than 1.5 nm, it can be seen that on/off ratio characteristics, mobility characteristics, threshold voltages and SS values appear.

Therefore, when the active layer comprises a metal oxide, for example, zinc oxide, the thickness of the active layer may preferably be greater than 1.5 nm. To this end, steps S210 to S240 may be repeated a predetermined number of times. For example, the predetermined number may be 1 or more. According to one embodiment, the predetermined number may be 7 or more.

FIG. 25 shows the results of testing the reliability of a multilevel element fabricated according to one embodiment of the present invention.

Referring to FIG. 25, it can be seen that the I-V curve of the multilevel element fabricated according to one embodiment of the present invention was maintained even after 180 days. In particular, it can be seen that the I-V characteristics in the second gate voltage range which is the current saturation range were well maintained. This suggests that a super-lattice structure composed of the active layer and the bather layer provides excellent stability.

Although the present invention has been described above in detail with reference to exemplary embodiments thereof, the scope of the present invention is not limited to these embodiment and should be construed based on the appended claims. In addition, any person of ordinary skill in the art will appreciate that various modifications and alterations are possible without departing from the scope of the present invention.

The invention claimed is:

1. A layer which exhibits a first number of electron states in a low-level electron energy range in a conduction band, and exhibits a second number of electron states in a high-level electron energy range higher than the low-level electron energy range in the conduction band, wherein the electron states in the low-level electron energy range are extended states, and wherein localized states exist between the low-level electron energy range and the high-level electron energy range.

2. The layer of claim 1, wherein the number of extended electron states in localized states in the conduction band is 0.

3. The layer of claim 1, wherein a maximum electron energy value in the low-level electron energy range is smaller than a minimum electron energy value in the high-level electron energy range.

4. The layer of claim 1, wherein the first number of electron states has a normal distribution in the low-level electron energy range.

5. The layer of claim 1, wherein a maximum value of the first number of electron states in the low-level electron energy range is smaller than a minimum value of the second number of electron states in the high-level electron energy range.

6. The layer of claim 1, wherein conduction states exist in the low-level electron energy range and the high-level electron energy range.

7. The layer of claim 1, wherein a mobility edge, which is the lowest energy state in which electrons are capable of existing, exists in the conduction band, and the low-level electron energy range and the high-level electron energy range have higher energy values than the mobility edge.

8. The layer of claim 1, wherein a curve of the first number of electron states in the low-level electron energy range and a curve of the second number of electron states in the high-level electron energy range are discontinuous with each other.

\* \* \* \* \*